United States Patent [19]

Rostoker

[11] Patent Number: 5,783,470
[45] Date of Patent: *Jul. 21, 1998

[54] METHOD OF MAKING CMOS DYNAMIC RANDOM-ACCESS MEMORY STRUCTURES AND THE LIKE

[75] Inventor: Michael D. Rostoker, Boulder Creek, Calif.

[73] Assignee: LSI Logic Corporation, Milpitas, Calif.

[*] Notice: The term of this patent shall not extend beyond the expiration date of Pat. No. 5,622,882.

[21] Appl. No.: 572,665

[22] Filed: Dec. 14, 1995

[51] Int. Cl.⁶ .................................................. H01L 21/8242
[52] U.S. Cl. ........................... 438/253; 438/251; 438/199
[58] Field of Search .............................. 437/919; 438/253, 438/254, 395, 199

[56] References Cited

U.S. PATENT DOCUMENTS

| | | | |
|---|---|---|---|
| Re. 31,079 | 11/1982 | Nagasawa et al. | 29/571 |
| 4,435,895 | 3/1984 | Parrillo et al. | 29/571 |
| 4,450,021 | 5/1984 | Batra et al. | 29/571 |
| 4,586,238 | 5/1986 | Yatsuda et al. | 29/571 |
| 4,761,384 | 8/1988 | Neppl et al. | 437/29 |
| 4,859,619 | 8/1989 | Wu et al. | 437/43 |
| 4,882,289 | 11/1989 | Moriuchi et al. | 437/52 |
| 4,897,364 | 1/1990 | Nguyen et al. | 437/69 |
| 4,903,109 | 2/1990 | Kooi | 357/50 |
| 4,929,565 | 5/1990 | Parrillo | 437/34 |
| 4,950,616 | 8/1990 | Kahng et al. | 437/31 |
| 5,026,657 | 6/1991 | Lee et al. | 437/47 |
| 5,073,509 | 12/1991 | Lee | 438/28 |
| 5,106,782 | 4/1992 | Matsuno et al. | 437/193 |
| 5,126,280 | 6/1992 | Chan et al. | 437/52 |
| 5,128,273 | 7/1992 | Ema | 437/52 |
| 5,134,085 | 7/1992 | Gilgen et al. | 437/52 |
| 5,153,685 | 10/1992 | Murata et al. | 257/306 |
| 5,168,073 | 12/1992 | Gonzalez et al. | 437/47 |
| 5,206,787 | 4/1993 | Fujioka | 257/307 |
| 5,225,365 | 7/1993 | Cosentino | 437/57 |
| 5,240,871 | 8/1993 | Doan et al. | 437/52 |
| 5,248,629 | 9/1993 | Muroyama | 437/52 |
| 5,262,344 | 11/1993 | Mistry | 437/57 |
| 5,283,203 | 2/1994 | Gill et al. | 437/34 |
| 5,286,668 | 2/1994 | Chou | 437/52 |
| 5,362,664 | 11/1994 | Jun | 437/52 |
| 5,385,859 | 1/1995 | Enomoto | 437/52 |
| 5,387,532 | 2/1995 | Hamamoto et al. | 437/52 |
| 5,409,856 | 4/1995 | Jun | 437/52 |
| 5,429,972 | 7/1995 | Anjum et al. | 437/47 |

FOREIGN PATENT DOCUMENTS

| | | | |
|---|---|---|---|
| 0356202 | 2/1990 | European Pat. Off. | H01L 21/336 |
| JA109586 | 4/1978 | Japan | H01L 21/26 |
| 6188365 | 7/1994 | Japan | H01L 27/04 |

OTHER PUBLICATIONS

Wolf, Stanley, *Silicon Processing for the VLSI Era*, "Process Integration", vol. 2, 1990, Sunset Beach, CA, 277–287, 381–385.

*Primary Examiner*—Jey Tsai
*Attorney, Agent, or Firm*—Oppenheimer Poms Smith

[57] ABSTRACT

A CMOS DRAM integrated circuit includes paired P-type and N-type wells in a substrate. The wells are fabricated using a self-aligning process. Similarly, FETs of the DRAM circuit are fabricated in the wells of the substrate using a self-aligning process to provide FETs of opposite polarity in a DRAM which may have paired memory cells and dummy cells for symmetry of circuitry. One or more layers having an irregular top surface topology may be planarized using mechanical or chemical-mechanical polishing of the topological layer.

19 Claims, 12 Drawing Sheets

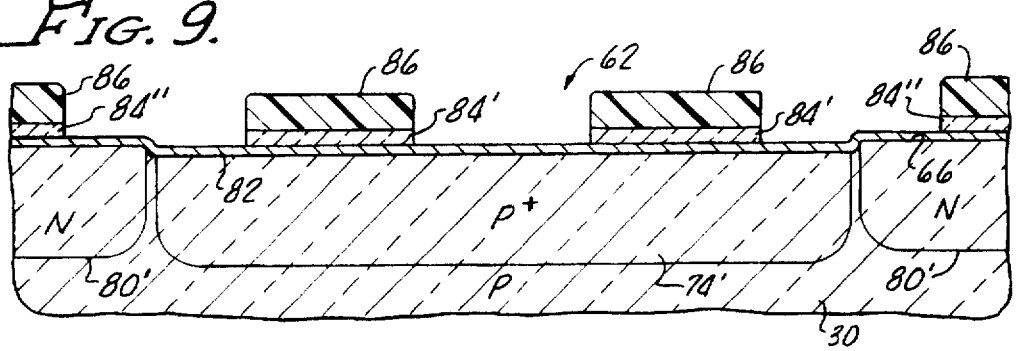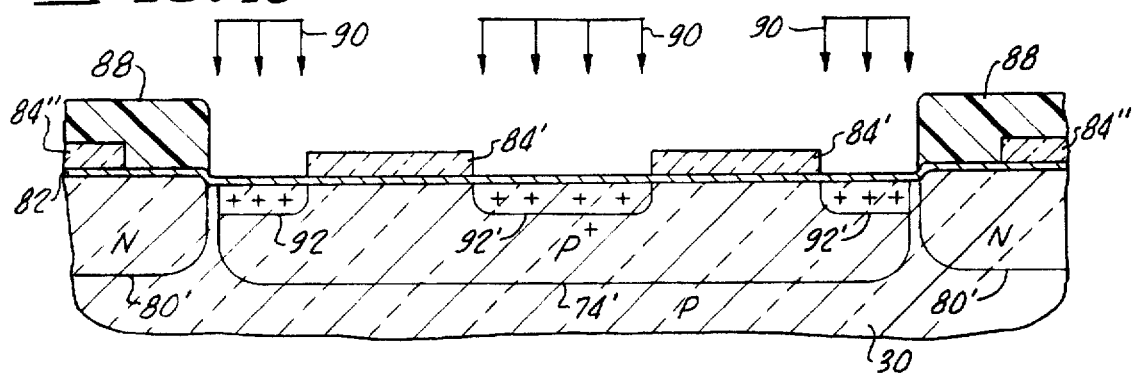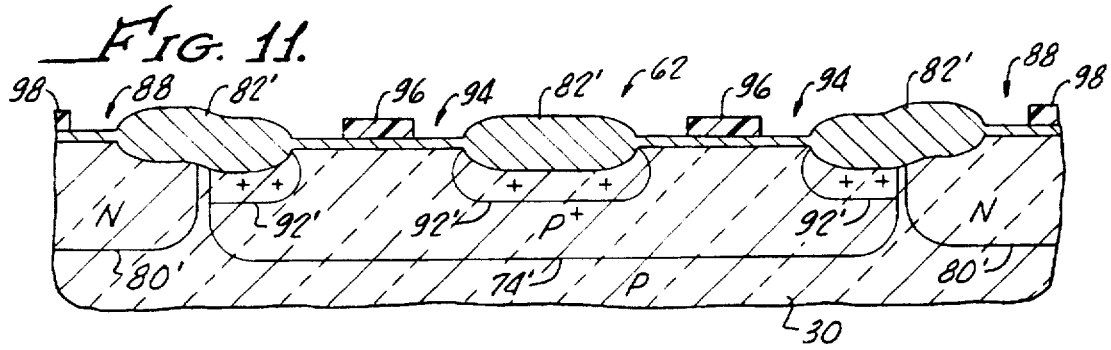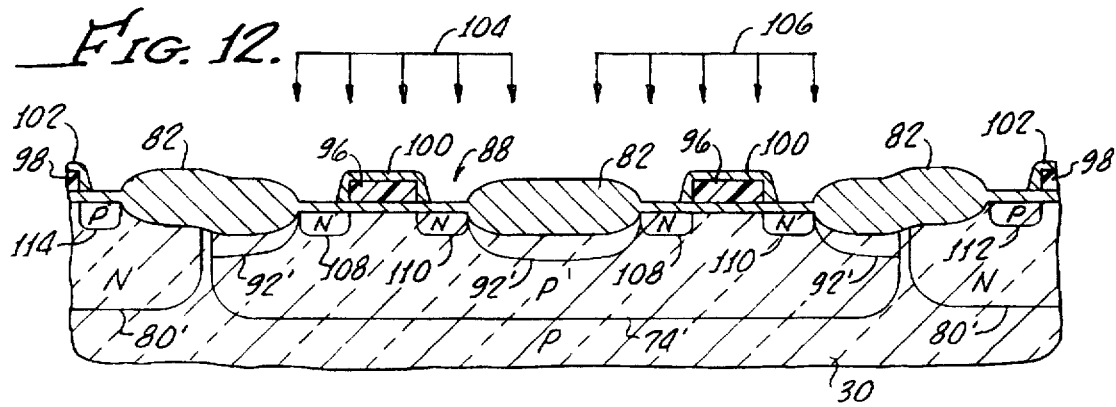

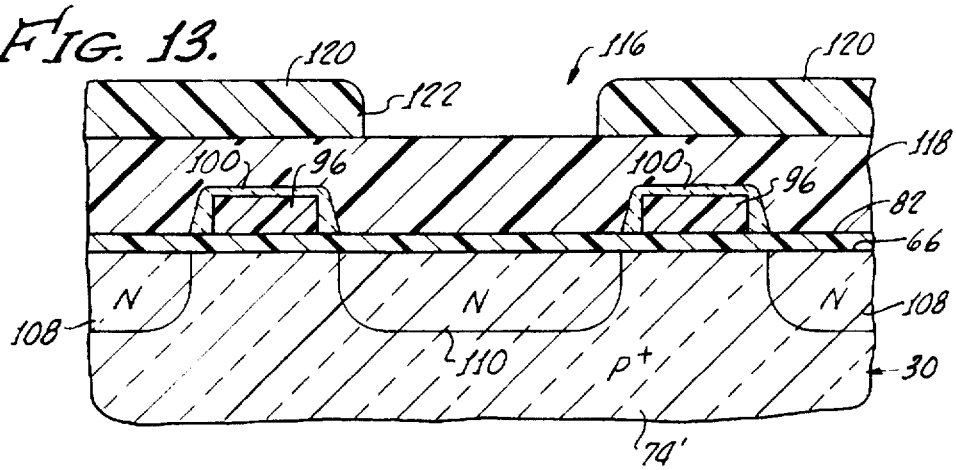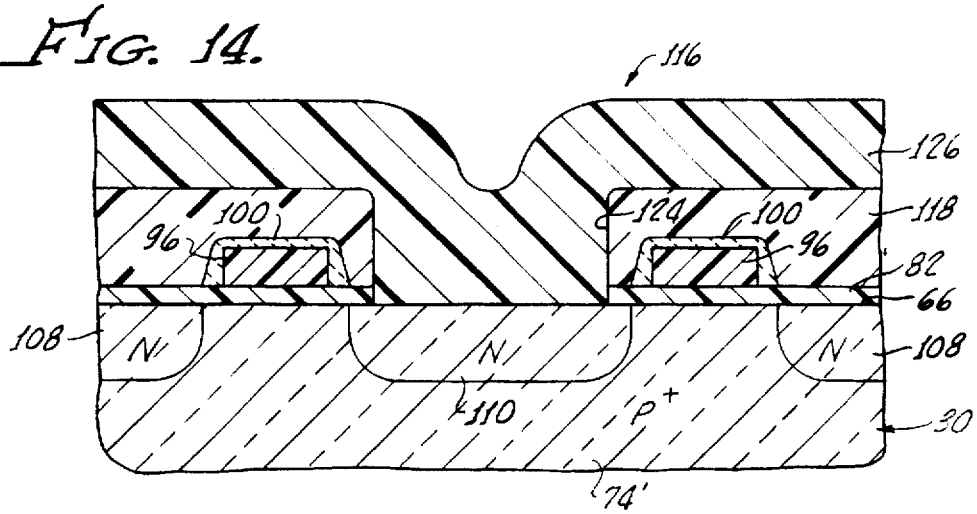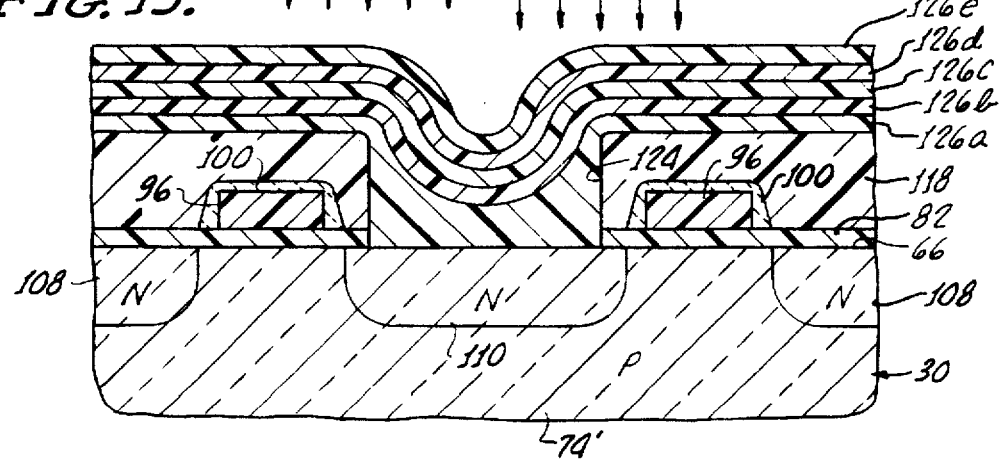

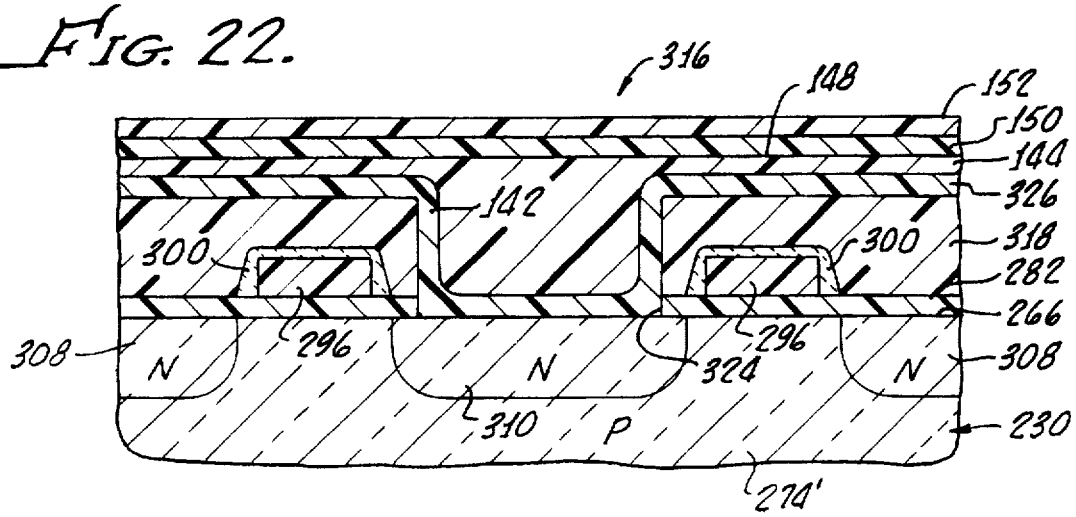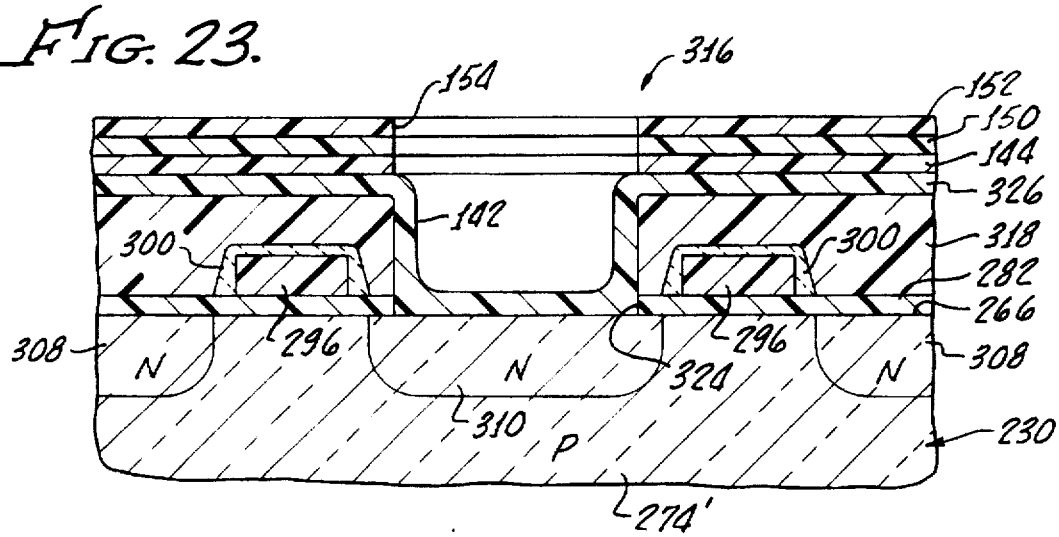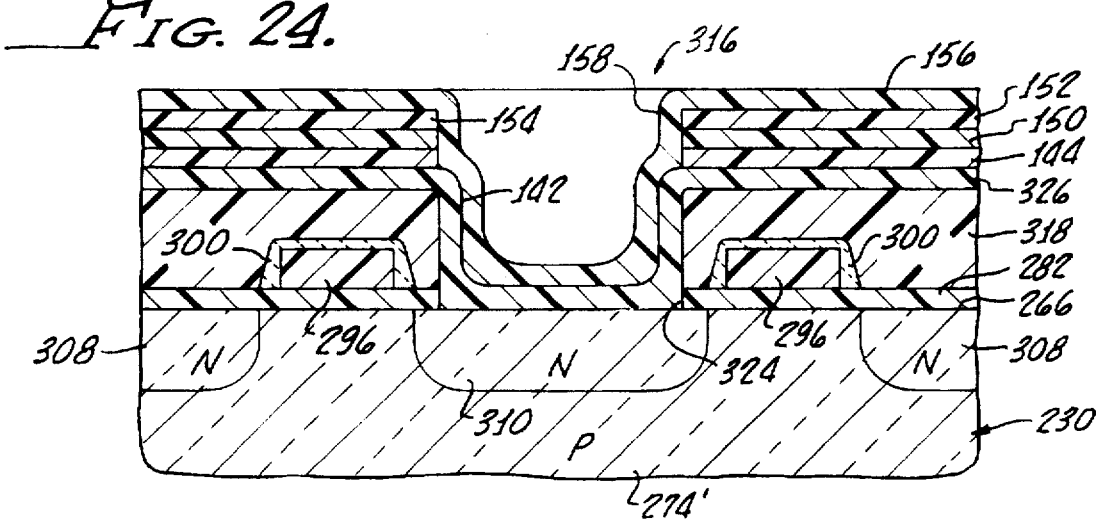

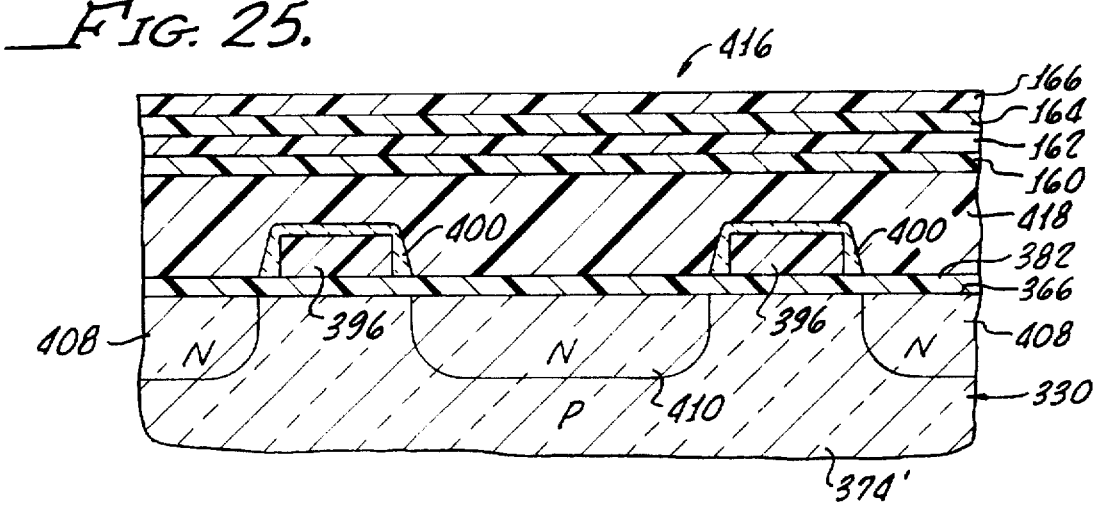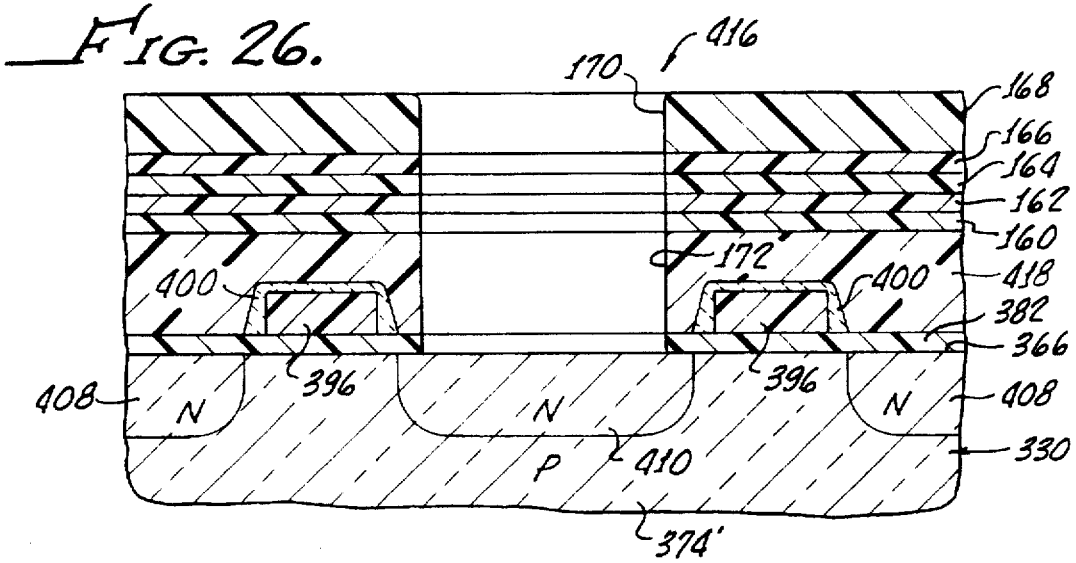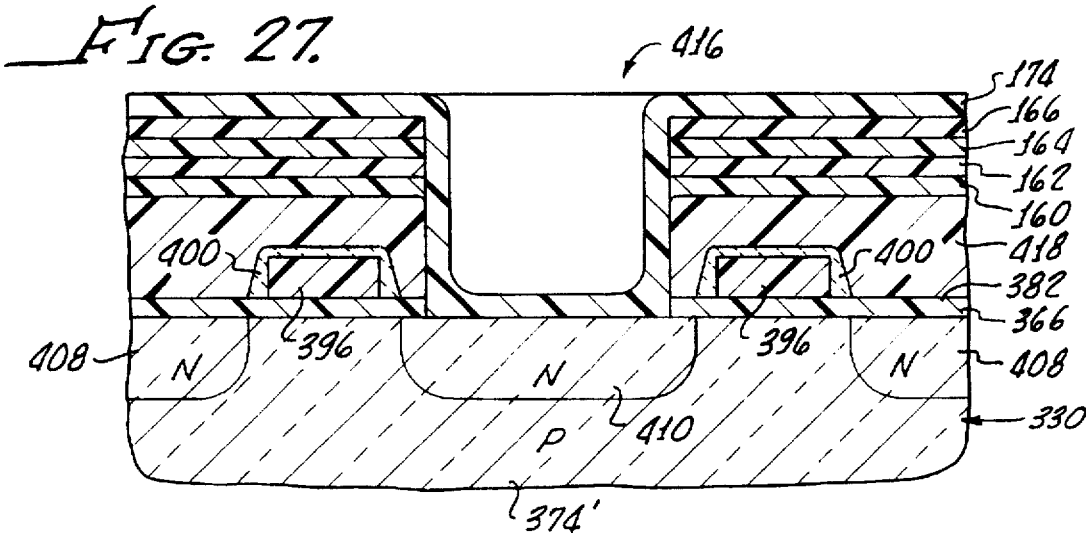

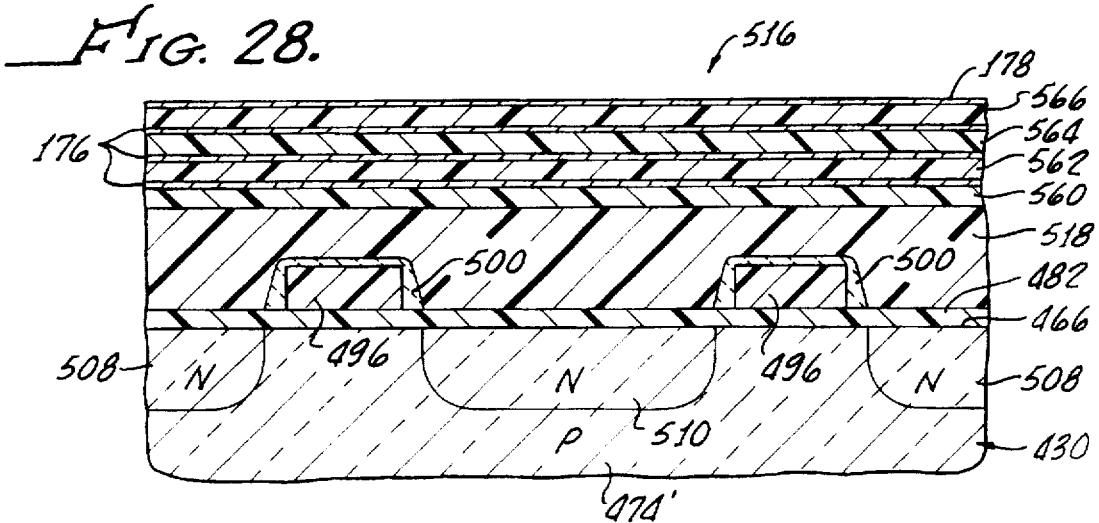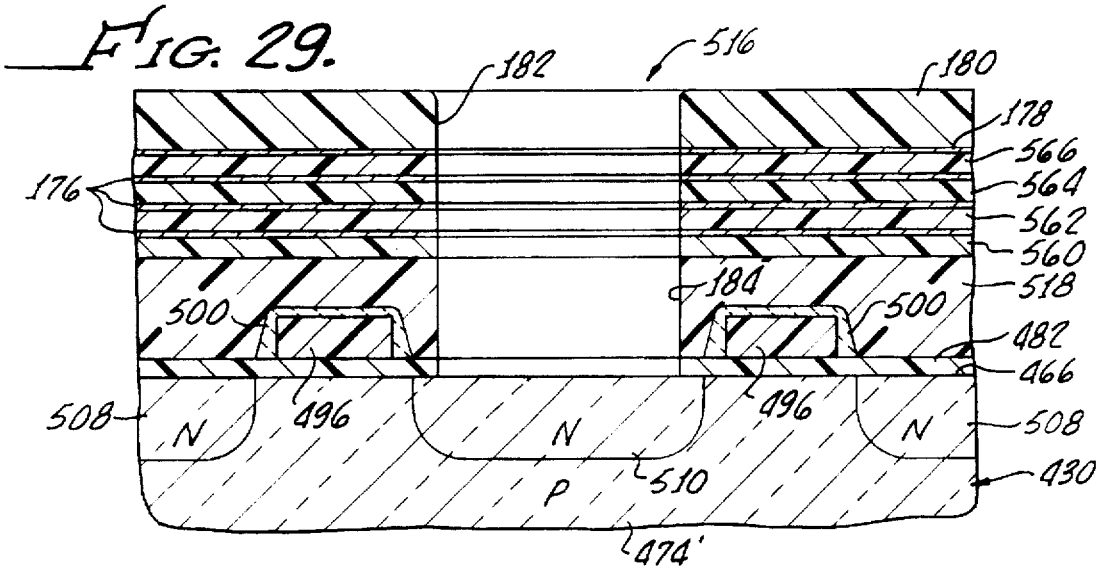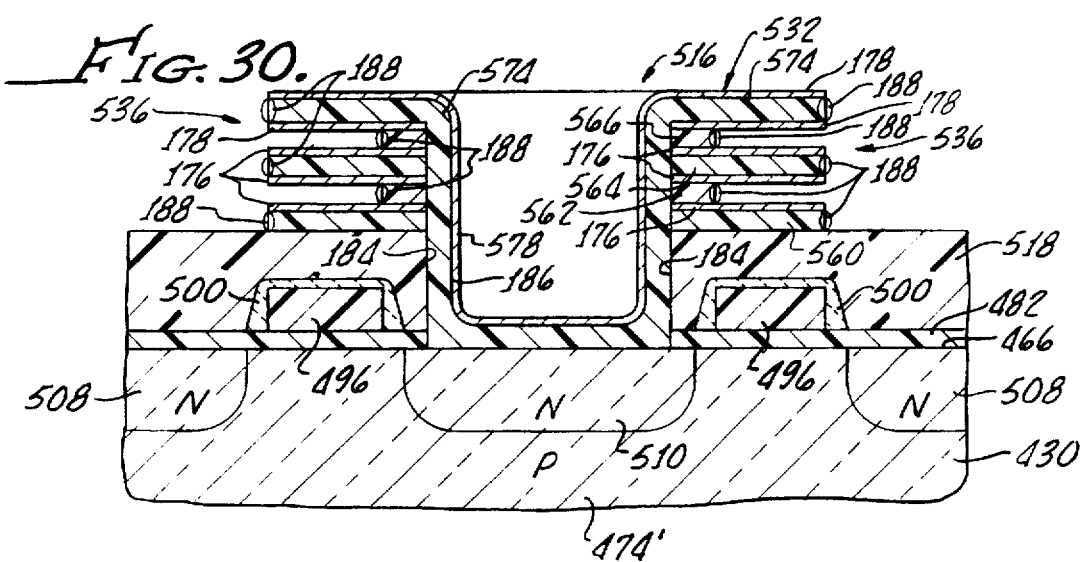

METHOD OF MAKING CMOS DYNAMIC RANDOM-ACCESS MEMORY STRUCTURES AND THE LIKE

BACKGROUND OF THE INVENTION

1. Field of the Invention

The invention relates generally to semiconductor device manufacturing processes and structures and, more particularly, to fabrication of semiconductor devices based on underlying Complementary-Metal-Oxide-Semiconductor (CMOS) structures. Still more particularly, the present invention relates to a method of making a CMOS DRAM memory circuit device that includes field effect transistors (FETs), and a capacitor associated with each FET to define each memory cell.

2. Description of the Prior Art

Integrated circuit technology is based on the ability to form numerous transistor structures in a single silicon substrate. Generally, there are two basic types of transistor structures: (1) bipolar and (2) field effect. In bipolar transistors, a base structure is disposed between and in contact with an emitter structure and a collector structure. In field effect transistors (FETs) there are two spaced-apart source and drain structures (or regions, analogous to the emitter and collector of a bipolar transistors. In a FET, a channel is formed in the surface of the silicon region between the source and drain regions. Tunneling of charges between the source and drain is controlled by a gate element (analogous to the base of a bipolar transistor) disposed over the channel. In some instances, the gate element of a FET is insulated from the channel, forming an Insulated Gate FET (IGFET).

Generally, the emitter/base/collector or source/drain regions of a transistor structure are formed by implanting ions (dopants), such as phosphorous or boron, into a surface of a semiconductor substrate. An N-type or a P-type region may be formed, depending on the polarity of the dopant. Usually, in order to form two dissimilarly doped regions adjacent one another (i.e., for a single transistor structure), the substrate must be masked.

It is commonly required that several transistor structures are formed on a single semiconductor die, and that the individual transistor structures are packed as closely together as possible. This generally requires some sort of isolation structure to be formed between adjacent transistor structures. To this end it is known, for example, to mask portions of the substrate that are intended to be implanted to form elements of transistor structures, and to thermally grow a silicon dioxide structure in unmasked areas of the substrate. One such technique is known as Local Oxidation of Silicon (LOCOS). Such LOCOS structures tend to grow not only above the surface of the substrate, but also tend to grow into the substrate. The portion of the LOCOS structure that grows above the surface of the substrate is exemplary of a non-planar topology that affects nearly every semiconductor device.

Additional layers and structures formed over the basic transistor structures to implement devices such as non-volatile memory (for example), or simply to effect interconnections between many of these structures on a substrate (e.g., on an integrated circuit die), evidently cause the top surface of the substrate to become very irregular or non-planar. Interconnections, for example, typically require several alternating layers of insulating material and conductive material and vias or plugs through the layers to make contact to other metal layers and to the underlying elements of the transistor structures. When applying subsequent layers, these topological features can present difficulties in obtaining layers of uniform thickness, good coverage at steps, uniform filling of vias, and the like. Hence, it is known to planarize the layers of a semiconductor device at various stages of fabrication.

An irregular topological feature occurs when, for example, a FET gate electrode is formed over a thin (e.g., 2 nm) layer of insulating material such as oxide and a thicker (e.g., 50 nm) layer insulating material such as nitride (silicon nitride). The gate electrode forms a rather prominent feature which tends to be elevated from the remaining surface of the transistor structure.

Numerous iterations of one or more of the aforementioned transistor structures, or the like, can be replicated and interconnected on an integrated circuit to effect complex circuit functions. In some instances, two adjacent transistors that are to be interconnected can share an element such as a source or drain with one another, thereby avoiding interconnection through overlying metal layers.

In a typical complementary-metal-oxide-semiconductor (CMOS) transistor structure, two complementary (opposite polarity) transistors are formed adjacent one another. For example, a first area of a substrate is masked (e.g., with photoresist) and another, second adjacent area is doped to form an N-well in the second area. The first area is prevented from being doped by the mask material overlying the first area. Then the mask is stripped, and a second mask is applied over the N-well. The now-exposed first area is doped to form a P-well. In this step, the mask overlying the N-well prevents the N-well from being doped during the P-doping step. Source and Drain implants for the N-well and P-well proceed in much the same manner, typically requiring one of the N- or P-wells to be masked while the other is being implanted. The Source and Drain regions are typically doped to a polarity opposite to that of the well in which they reside.

Desirable objects of semiconductor design, generally, include minimizing process steps, ensuring reliable fabrication of various structures, and achieving desired functionality. Often, these goals may compete against one another. Hence it is desirable, for a given intended semiconductor design, to implement steps (or a series of steps in an overall fabrication scheme) that can achieve one or more of these objectives, without detracting from another of the objectives. For example, it is generally considered desirable if one layer can serve two functions (e.g., as an insulating layer and as an implant mask).

Another factor of concern in semiconductor design is thermal budget. As mentioned above, isolation structures are often formed using a thermal process. Such application of heat to a substrate will also have the effect of diffusing (spreading) out fugitive ionic species (dopants) that have already been implanted into the substrate. While, in some cases, such diffusion of implants is advertent, in other cases it is an unwelcome side effect of other fabrication processes. In either case, any thermal processing of the substrate subsequent to implantation must be accounted for in the design of the process and of the device. As an example, it is known to deposit, densify and re-flow a layer of glass to establish a planar top surface of an in-process substrate, for example so that subsequent layers can reliably be applied. Each of these steps requires a thermal cycle at an elevated temperature. In the case of depositing, densifying and re-flowing a glass layer, which would typically occur after several implants have already been performed, the re-flow step (in particular) places an enormous strain on the thermal budget of the process.

SUMMARY OF THE INVENTION

As discussed hereinabove, there are many different ways in which transistor structures can be fabricated, each having its own advantages and disadvantages. There clearly remains a need for improved DRAM structures, and for improved processes for fabricating both old and improved transistor structures. Accordingly, the present invention provides an improved process CMOS DRAM structures that includes masking to provide self alignment, fabricating channel stop areas, N-wells and P-wells. The method may also include effecting planarization at various stages in the fabrication process.

A more particular object for the present invention is to provide an improved method of fabricating memory cell transistors in a DRAM which also includes a capacitor structure associated with each memory cell transistor.

Yet another object for the present invention is to provide an improved method of fabrication such a DRAM memory integrated circuit which includes associated transistors and capacitors for memory cells, and which also includes plural metallization and insulation layers over the memory cells.

The processes according to the present invention are particularly useful in providing an improved method of fabricating memory cell transistors in a DRAM which also includes a capacitor structure associated with each memory cell transistor.

The processes of the present invention are also useful in providing an improved method of fabricating a DRAM memory integrated circuit that includes associated transistors and capacitors for the memory cells and that also includes plural metallization and insulation layers over the memory cells.

A self-aligning photolithographic method according to the invention of making a CMOS-DRAM device having multiple memory cells, each said multiple memory cells including a FET and a capacitor comprises the steps of: providing a substrate of silicon semiconductor material; forming a first silicon nitride layer on said substrate; patterning said first silicon nitride layer to define an opening through said first silicon nitride layer to said substrate; forming a first well by a method that includes the steps of: implanting a first dopant of a first conductivity type into a first sub-surface region of said substrate through said opening, such that said sub-surface region is self aligned with a portion of said substrate that is aligned with said opening; and using said first silicon nitride layer to substantially prevent said substrate from being implanted with said first dopant except at said opening; forming a silicon oxide layer in said opening; removing said silicon nitride layer; forming a second well adjacent said first well by a method that includes the steps of: implanting a second dopant of a conductivity type opposite to the conductivity type of the first dopant into a second subsurface region of said substrate that is adjacent to said layer of silicon oxide; and using said layer of silicon oxide to substantially prevent implantation of said second dopant into said first well; forming in said first well region of said substrate a spaced apart pair of source and drain implants of like conductivity type which is opposite to the conductivity type of said first well region; forming a gate element over said substrate aligned between said pair of source and said drain implants to define said FET; coating said gate element with a layer of oxide over said substrate; forming a material layer over said silicon oxide layer; forming a capacitor structure over said substrate in alignment with one of said source and drain implants; and including in said capacitor structure a conductive one capacitor plate structure with a portion extending through said heavy oxide layer and contacting one of said source and drain implants.

The method according to the invention may further include the steps of: forming a second silicon nitride layer on said substrate; patterning said second silicon nitride layer to define a pair of spaced apart silicon nitride segments that align respectively with said source and drain implants; forming a layer of silicon oxide by local oxidation on said substrate where said substrate is not covered by said segments of said second silicon nitride layer; removing said segments of said second layer of silicon nitride; forming a gate element on said substrate in alignment over portions of said substrate not covered by second layer so silicon oxide sites for said source and drain implants; and implanting a source and drain dopant of conductivity type opposite to said one well into said substrate to form said source and drain implants while using said layer of silicon oxide, and said gate element to substantially prevent said substrate from elsewhere being implanted with said source and drain dopant.

According to the method of the present invention, doped wells or regions in a silicon substrate are created using one or more oxide growths on the surface of the substrate to mask implantation of ions into the wells. The oxide growths are formed after one photoresist masking step. By using the oxide growths as an ion implantation mask, additional photoresist masking is avoided, thereby simplifying the manufacturing process. The oxide growths preferably are LOCOS structures, which perform an isolation function in a completed semiconductor device.

According to the method of the invention, the thick oxide growths may be used to create a pair of adjacent complementary oppositely-doped wells for a CMOS DRAM structure.

Additional objects and advantages of the present invention are described in the following detailed description of a preferred embodiment of the invention, taken in conjunction with the drawing, which are briefly described below.

DESCRIPTION OF THE DRAWINGS

FIGS. 5–12 represent greatly enlarged and diagrammatic cross sectional views of a work piece at particular sequential stages of manufacture of a DRAM integrated circuit memory formed by processes according to the present invention;

FIGS. 13–19 present greatly enlarged and diagrammatic cross sectional views of a work piece at particular sequential and respective stages of manufacture of a DRAM integrated circuit memory according to the present invention; and each FIG. illustrates steps in the method of manufacture of the DRAM;

FIGS. 21–24 present greatly enlarged and diagrammatic cross sectional views of a work piece at particular sequential and respective stages of manufacture of an alternative DRAM integrated circuit memory according to the present invention similarly to FIGS. 13–19; and each FIG. illustrates steps in an alternative method of manufacture of the DRAM;

FIGS. 25–27 also present greatly enlarged and diagrammatic cross sectional views of a work piece at particular sequential and respective stages of manufacture of another alternative DRAM integrated circuit memory according to the present invention similarly to FIGS. 13–19 and FIGS. 21–24; and each FIG. of this group illustrates steps in an alternative method of manufacture of the DRAM;

FIGS. 28–30 present greatly enlarged and diagrammatic cross sectional views of a work piece at particular sequential and respective stages of manufacture of yet another alternative DRAM integrated circuit memory according to the present invention similarly to FIGS. 13–19, FIGS. 21–24, and FIGS. 25–28; and each FIG. of this group illustrates steps in the respective alternative method of manufacture of the DRAM;

DETAILED DESCRIPTION OF THE INVENTION

Integrated Circuit DRAM Structure Including FET and Capacitor

Figure 1:
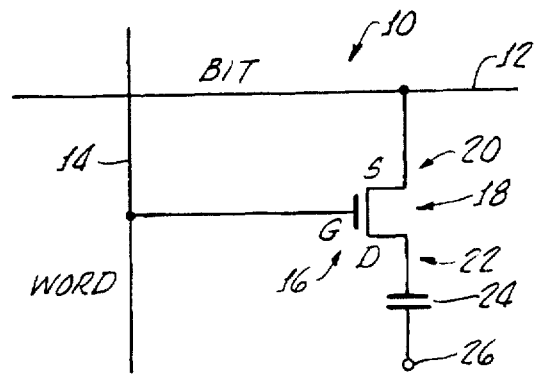
FIG. 1 provides a schematic representation of a DRAM memory cell with a charge storage capacitor and a transistor for accessing the memory cell.

FIG. 1 schematically illustrates the simplest type of dynamic random access memory cell (DRAM) 10, which includes a field effect transistor (FET)18 and a capacitor 24. The DRAM cell 10 includes associated portions of respective bit and word lines 12 and 14. The word line 14 is connected to a gate 16 of the FET transistor 18, while the bit line 12 is connected to one of the source and drain 20, 22 of the transistor 18. The FET 18 controls charge storage and charge reading on one plate of the capacitor 24. The other plate of the capacitor 24 is connected to a memory enable node 26, which is a common connection among the multitude of memory cells of a DRAM.

Schematically, the memory cells and dummy cells of a DRAM are the same. Physically, the memory cells and dummy cells may be the same or may be distinguishable from one another by opposing polarities of the associated FET transistors of the cells. When a bit is stored on such a cell, the electric charge for a one or a zero is stored on the memory cell, and the charge value for one-half of one is stored on the associated dummy cell. Later, when the memory cell is interrogated, the charge values of both the memory cell and the dummy cell are read simultaneously. The sign of the difference between these two stored charges indicates whether the stored value was a one or a zero.

Alternatively, a DRAM may include only memory cells, without paired dummy cells, and center-point sensing may be used to determine whether a one or zero is stored on a particular cell when the cell is interrogated. The voltage perturbation occurring on a pre-charged trace to which a particular cell is connected when its associated FET is closed is a comparison of the voltage stored on the capacitor of the cell to the reference, or center point, voltage maintained on the trace, and is an indication of whether the memory cell stored a one or a zero.

The source and drain of a FET transistor are effectively interchangeable. The identification of the source and drain is an indication of the direction of current flow. Accordingly, the schematic representations for a memory cell and dummy cell are the same. Preferably, the FETs of the memory cells are NMOS because of the speed advantage over the PMOS FETs. However, PMOS FETs are present in the integrated circuit as part of the peripheral support (read/write, clock, address, and amplification) circuitry sections of the DRAM memory device. Alternatively, the memory cells of a CMOS DRAM may be based on PMOS FETs, or may include both NMOS and PMOS FETs. Memory cells are ordinarily paired with dummy cells for purposes of circuit symmetry and ease of design of reading amplifiers for the DRAM.

Figure 2:
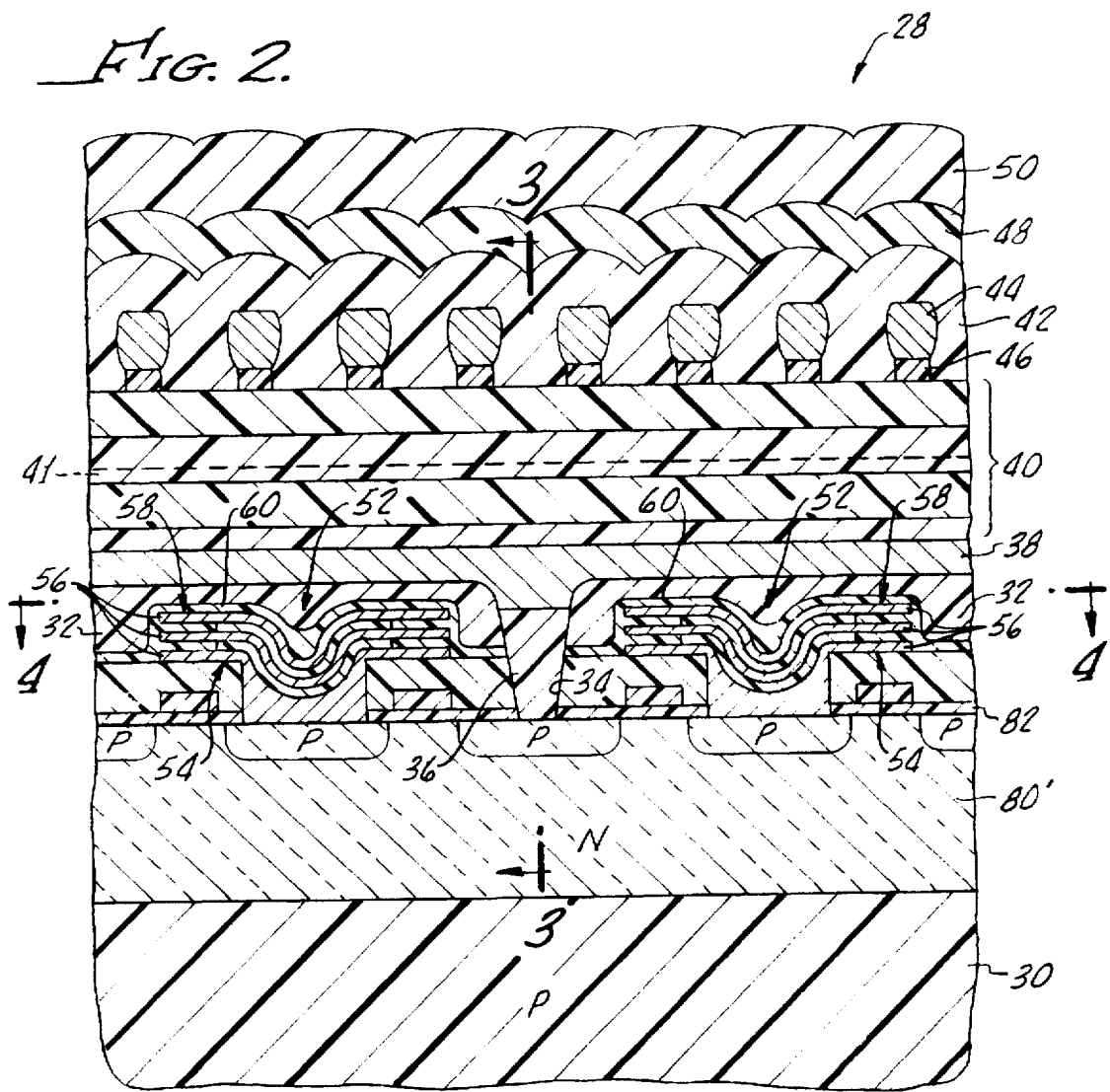
FIG. 2 is a greatly enlarged fragmentary cross sectional view through a memory cell of a DRAM integrated circuit according to the present invention.
Figure 3:
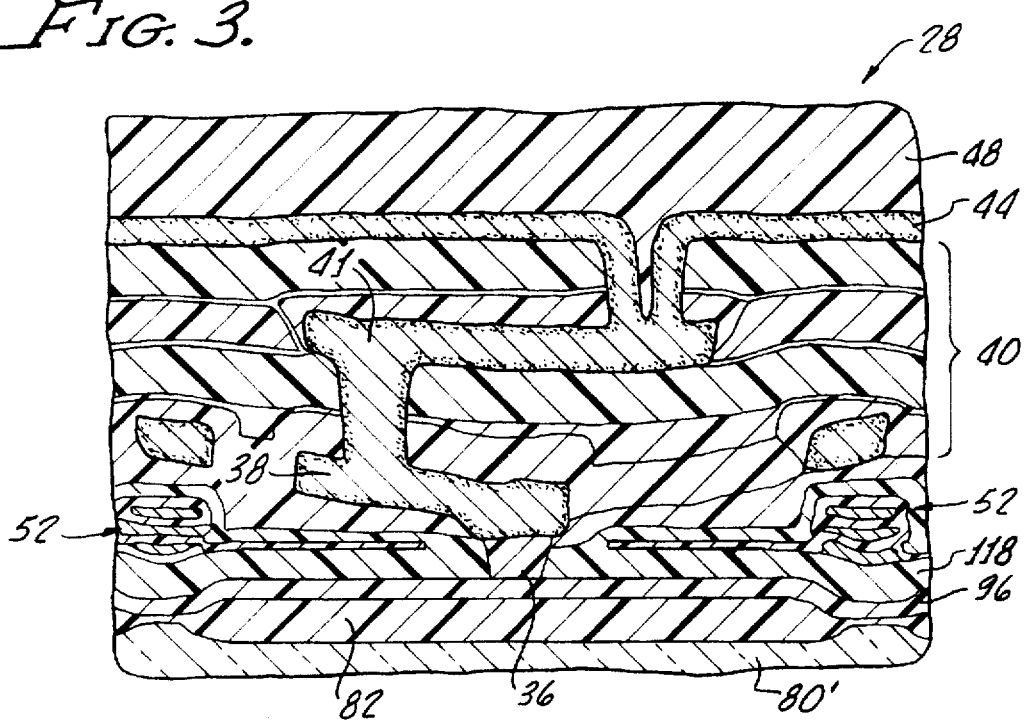
FIG. 3 is an enlarged fragmentary cross sectional view taken generally along line 3—3 of FIG. 2.
Figure 4:
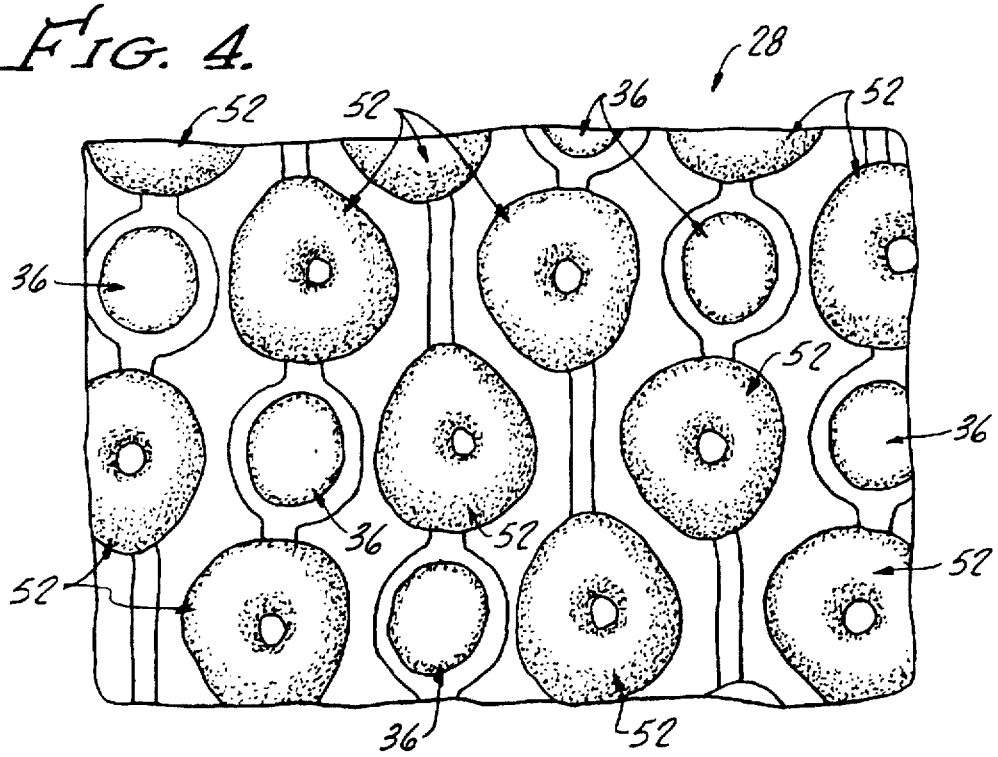
FIG. 4 is an enlarged fragmentary cross sectional view taken generally along line 4—4 of FIG. 2.

FIGS. 2 and 3 are vertical cross sectional view of a DRAM cell 28 formed in accordance with the method of the present invention. FIG. 4 is a horizontal cross sectional view of the DRAM cell 28 shown in FIGS. 2 and 3. The DRAM cell 28 includes a silicon substrate 30 within which is formed the FETs of the memory cells. Preferably, the substrate 30 is P-type silicon. A composite silicon oxide layer 32 is formed on the silicon substrate 30. This silicon oxide layer 32 has openings 34 through which pass plugs 36 of conductive polysilicon. In each case where polysilicon is used in fabrication the structure of the DRAM cell 28, amorphous silicon may be substituted for the poly-crystalline silicon. This is possible except as is pointed out below where amorphous silicon and polysilicon are used together, and the difference between the isotropic etching rate of the amorphous silicon and polysilicon is used to define a feature of the capacitor 24.

The conductive plugs 36 are effective to connect features formed near the interface of the silicon substrate 30 and oxide layer 32 with respective traces formed in a first metallization layer 38. Several layers of insulation, including oxide and inter-level dielectric materials, all collectively referenced with the numeral 40 are formed on the first layer of metallization 38. A second layer or metallization 41 is formed within this layer 40 of materials. An oxide layer 42 is formed on the layers of insulation 40. Conductive metal traces 44 for forming bit, word, and other necessary interconnections within the DRAM cell 28 are formed on the oxide layer 42. The oxide layer 42 also includes inter-layer dielectric materials 46. Finally, on the layer 42 is formed an additional oxide layer 48, and a top passivating silicon nitride layer 50.

Multiple capacitor structures, generally indicated with the numeral 52 are embedded within the thick oxide layer 32. These capacitor structures 52 are generally disk-like, and are generally circular in plan view as may be seen viewing FIG. 4, although other configurations such as rounded triangular shapes in plan view, for example, may be used for these capacitor structures. Each of these capacitor structures 52 includes an inner annular capacitor plate structure 54 preferably formed at least in part of conductive polysilicon, and which includes plural annular fins 56 extending outwardly. The inner capacitor plate structure 54 may be formed of other materials, as will be further described below. Insulating the fins 56 is a layer of dielectric, generally indicated with the numeral 58. Around the dielectric 58 and plate structure 54, as well as between the fins 56, is an outer plate structure 60 formed of conductive polysilicon.

The structures and features of the DRAM cell 28 of FIGS. 2–3 are preferably as follows: Metallization 38 is preferably tungsten, as is metallization 41 as well. The gates 16 of the FET transistors 28 have a length of 0.35 mm, while the memory cells have a pitch of 0.9×1.8 mm. Metallization is used to form the traces 44, and is preferably composed of silicon doped aluminum on a tungsten barrier metal. $P^+$, and N⁺ implantations are used for the sources and drains of the respective FETs 18.

Method for Fabricating Self-Aligned Twin-wells in a DRAM Structure

Figure 5:
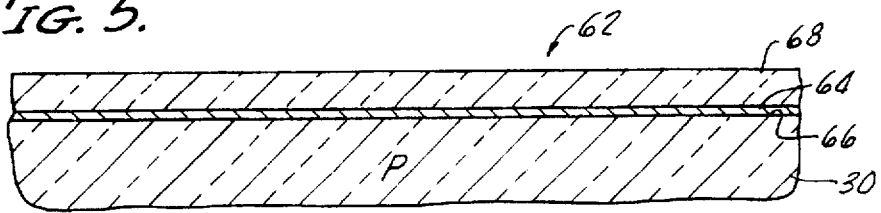

FIG. 5 illustrates a portion 62 of a silicon substrate 30 that is to become the site of a FET 32. An oxide layer 64 is formed on a surface 66 of the substrate 30. The oxide layer 64 may be formed using a thermal oxidation process, or may be deposited by use of CVD, for example. A silicon nitride layer 68 is formed on the oxide layer 64 as shown in FIG. 5.

Figure 6:
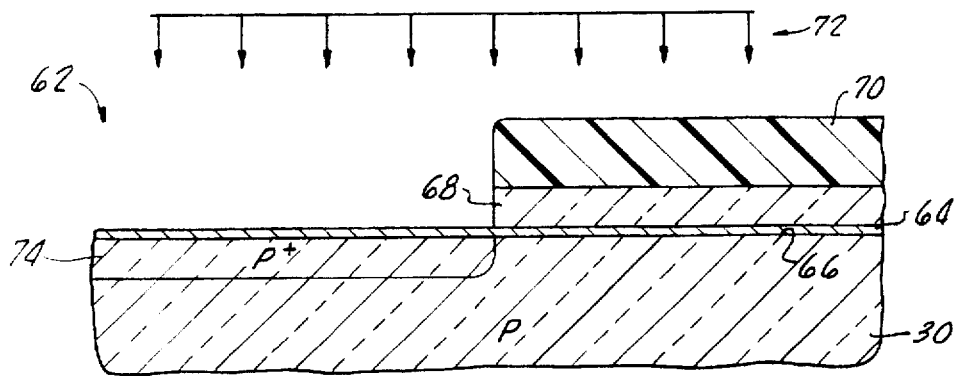

Referring to FIG. 6, the silicon nitride layer 68 may be patterned using a photoresist layer 70 that is similarly exposed in a corresponding pattern and then partially removed. Thus, a portion 63 of the site 62 is covered only by the thin oxide layer 64.

Subsequently, as is depicted in FIG. 6 with the arrows 72, an ion bombardment implantation (or diffusion) process is performed to implant a shallow subsurface region 74 of the substrate 30 with appropriate ions for forming either a P-well or an N-well. The ion bombardment 72 (or diffusion) is conducted over the entire upper surface of the substrate 30, and is not localized as may be suggested by the constraints of illustration as seen in FIG. 6. As depicted in FIG. 6, the implantation for well 74 is of an ion species of a P-type. This implantation or diffusion is conducted through the thin oxide layer 64. However, the photoresist 70 and silicon nitride layer 68 together form an effective barrier against the implantation of the selected ion species into the part 65 of substrate 30 which is still covered.

Subsequently, then photoresist layer 70 is removed; and the substrate 30 is exposed to a thermal oxidation process. The heat and oxidant of this thermal oxidation process cause the ions implanted into region 74 to diffuse through the silicon substrate material 30 so that a well 74' of the selected P-type or N-type is created. As depicted, well 74' is of P-type. The P-well 74' will also spread somewhat laterally with respect to the location of the implant 74.

Figure 7:
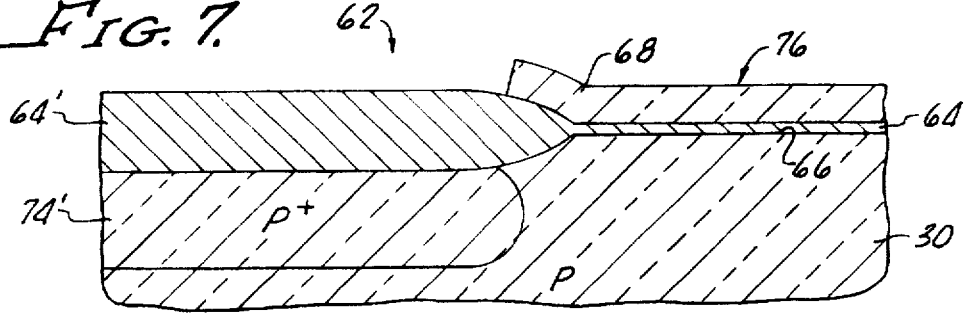

Also, the thermal oxidation process causes the thin oxide layer 64 to grow thick where it is not covered by the silicon nitride layer 68. Thermal oxidation also causes the oxide layer 64 to grow under the silicon nitride layer 68 somewhat. This thickened layer of silicon oxide is indicated with the numeral 64'. It will be understood that when the oxide layer 64 is not included, the silicon of the substrate itself will be oxidized to provide the thick oxide layer indicated with the numeral 64' in FIG. 7. Moreover, even when oxide layer 64 is included, the silicon of the substrate 30 will be involved in the growth of the thick oxide layer 64' so that some of the silicon of the substrate 30 is consumed, and the surface 66 defines a basin over the P-well 74', or defines a step up from this basin at the perimeter of this P-well. The thermal oxidation process may cause an incidental thin oxide layer 76 to form over the nitride layer 68. This incidental oxide layer 76 is easily removed with an etching process.

Figure 8:
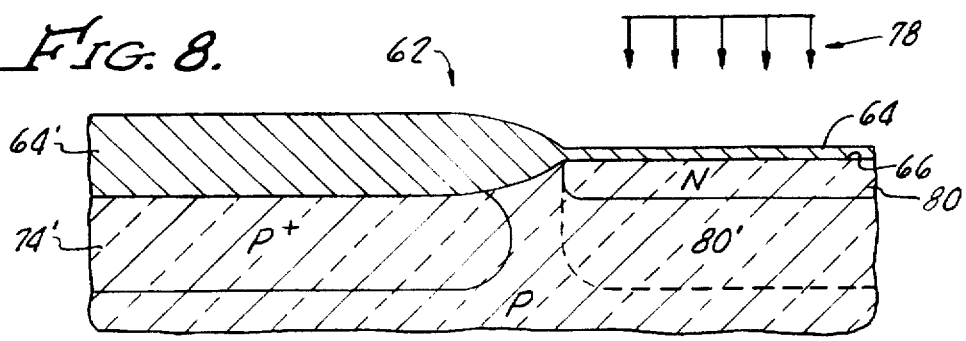

FIG. 8 shows that the thick silicon nitride layer 68 is then removed, for example by the use of chemical etching, so that the part 65 of substrate 30 at site 62 which had previously been covered with the silicon nitride layer 68 is now covered only by the thin oxide layer 64. The thick oxide layer 64' will have spread laterally as seen in FIG. 8 so that the well 74' is substantially covered. An implantation (or diffusion) process, indicated by arrows 78, is conducted to implant a shallow subsurface region 80 of the substrate 30 with ions appropriate for forming an N-well. As described previously, the limitations of illustration are not intended to indicate that only a localized ion bombardment or diffusion is conducted.

The bombardment or diffusion effects the entire upper surface of the substrate 30. The implantation depicted in FIG. 8, the 80 is of N-type material. This implantation or diffusion is conducted through the thin oxide layer 64. However, the thick oxide layer 64' forms an effective barrier against the implantation of the ions into the well 74'.

Subsequently, the oxide layers 64 and 64' are removed. Another thermal processing step is used to effect the diffusion of implant 80 to form a well 80'. The well 80' is shown in FIG. 8 with a dashed line to indicate the size of this well. It is understood that dopant ions diffuse at different rates during thermal diffusion processes. Therefore, even though the P-well 74' has been exposed to two thermal diffusion processes (one for growing the thick oxide layer 64' and diffusing the implant 74 to well 74', and another for diffusion of the N-well implant 80), the N-well will still generally have a greater diffusion into the material of the substrate 30. Also, the upper surface 66 will exhibit a step into a basin or recess at the P-well 74'. This step is created because some of the silicon substrate material is consumed in forming the thick oxide portion 64' and is subsequently stripped away with the oxide layers 64 and 64'. Also as best seen in FIG. 9, the thermal diffusion process for the N-well 80' may be used to perform a thermal oxidation process that produces a comparatively thin uniform oxide layer 82 on the surface 66. The thin oxide layer 82 is of substantially uniform thickness over both the P-well 74' and the N-well 80'.

Method of Fabricating Source and Drain Implants with Channel Stops in a DRAM Structure FIG. 9 illustrates the next subsequent phase in the making of a DRAM integrated circuit according to the method according to the invention. This next phase involves forming source and drain implantations for the FET 32. FIG. 9 is centered at one of the P-wells 74' rather at the transition between a P-well and N-well, as were FIGS. 1-4. Corresponding structures are produced by corresponding steps at the N-wells, except as explained below.

FIG. 9 shows the substrate 30 with wells 74' and 80' upon which a layer 82 of oxide and a layer 84 of silicon nitride have been deposited. The layer 84 of silicon nitride has been patterned with photoresist 86, and has been partially removed (as by chemical etching, for example) to leave paired segments 84' and 84" in each one of the respective wells 74' and 80'. The location of the segments 84' is the future site for the source and drain of a P-channel FET, while the location of the segments 84" is the future site for the source and drain of an N-channel FET, recalling the usual circuit symmetry of DRAM devices.

FIG. 10 shows that a layer 88 of masking material is applied over the structure seen in FIG. 5, is patterned, and is partially removed to uncover the P-wells while masking the N-wells. An implantation process, indicated by arrows 90, is conducted to implant a sub-surface channel stop region 92 of the P-well 74' with appropriate ions for forming more highly doped P⁺⁺-type channel stops for the future N-channel FETs in the P-well 74'. Again, the limitations of the illustration are not intended to indicate that this ion implantation is localized. This implantation or diffusion is conducted over the entire upper surface of the substrate 30 and through the thin oxide layer 82. However, the nitride layer 84 and the mask layer 88 each form effective barriers against the implantation of the ions into the covered portion of the P-well 74', and into the N-well 80'.

FIG. 11 illustrates that the mask layer 88 is subsequently removed and that a following thermal oxidation and diffusion process results in the growth (thickening) of the oxide layer 82 between the segments 84' and 84" of nitride to form thick thermal oxide portions 82'. The thermal oxidation and diffusion process results also diffuses the more highly doped P$^{++}$-type channel stop implantations 92 to form the channel stops 92' for the future N-channel FETs in the P-well 74'. FIG. 11 also shows that the segments 84' and 84" have been removed to leave plateaus 94 over each of the P-well 74', and N-well 80'. Centered upon each plateau 94 is a respective deposition 96, 98 of polysilicon, which will become the gate of the future FETs. The polysilicon depositions 98 over the N-wells 80' are shown only fragmentarily.

FIG. 12 depicts the addition of respective oxide covers 100, and 102 over the gates 96 and 98. Two subsequent implantation steps, one performed for the P-well and one for the N-well, and respectively indicated with the arrows 104 and 106, form the respective source and drain regions 108, 110, and 112, 114, respectively, in the P-well, and in the N-well. The implantation steps 104 and 106 are performed separately with appropriate masking (with photoresist, for example), which is not shown in FIG. 12, so that the implantations for the sources and drains in each of the P-well and N-well do not interfere with or cross contaminate one another.

A DRAM cell also includes similar N-wells 80', with P-type implantations corresponding to the N-type implantations described above to form an N-channel FET (not shown in FIG. 12) for circuit symmetry. Except for the substitutions of materials required to form the N-channel FET, the process steps described above with reference to FIGS. 1–12 is repeated.

Formation of the Capacitors in a DRAM Structure

FIGS. 13–30 illustrate steps that may be used in methods according to the invention for making the multitude of capacitors 52. The steps carried out to fabricate one of the multitude of capacitors 52 result also in the structuring of all of these capacitors. Also, for purposes of simplicity of illustration, FIGS. 13–30 are presented as though the substrate 30 provided a flat or planar surface upon which to fabricate the capacitors 52. Recalling FIGS. 1–12, it can be seen that the surface of substrate 30 is not truly flat. However, the deviation of substrate 30 from flatness or planarity is not detrimental to the processes described below, or to the resulting DRAM structure.

Referring to FIG. 13, a portion 116 of the silicon substrate 30 which is to become the site of one of the capacitors 52 is depicted. The substrate 30 has a pre-formed P-well 74', with pre-formed N-type implantations 108, 110, as described above. The N-type implantations 108, 110 will become the sources and drains of respective P-channel FETs of the DRAM cell 28, as described subsequently. The DRAM cell 28 also includes similar N-wells 80', with counterpart P-type implantations 112, 114 to form N-channel FETs for circuit symmetry (not shown in FIG. 13). The P-well and N-well, as well as P-type and N-type implantations are indicated also with the respective characters "P" and "N". A layer 82, 82' of silicon oxide is formed on the surface 66 of the substrate 30, only the uniform thin portion 82 of the layer 82/82' being seen in FIG. 13. The layer 82, 82' of oxide may be formed using a thermal oxidation process as was explained above, or may be deposited by use of CVD, for example.

Oxide covers 100 are formed on the oxide layer 82 and on the polysilicon gates 96. A thick oxide layer 118 is formed over the oxide layer 82, gates 96, and covers 100. A photoresist layer 120 applied over the oxide layer 118. The photoresist layer 120 is patterned and partially removed to leave an opening 122 that is aligned with an underlying one of a source or drain implantations 108, 110 (also indicated with the character "N" in the drawings) within the substrate 30. Recalling the schematic representation of the DRAM memory cell presented in FIG. 1, it will be understood that the implantation with which the opening 122 aligns is a source or drain for one of the FETs 18.

An anisotropic etching operation is performed to produce a hole 124 (best seen in FIG. 14) through the oxide layers 82 and 118 to the surface 66 of the substrate 30. The photoresist 120 is removed, and a layer 126 of polysilicon is deposited over the layer 118 of oxide and into the hole 124. Thus, it will be understood that the polysilicon layer 126 makes contact with the N-type implantation in the underlying substrate 30 (or with a P-type implantation in the case of N-channel FETs). As depicted, the implantation 110 is contacted by the layer 126 of polysilicon.

FIG. 15 shows that plural sequential ion implantations indicated by the arrows 128 and 130 are subsequently conducted over the entire upper surface of the substrate 30. For simplicity of illustration, the implantation arrows 128 and 130 are shown over only a portion of the substrate 30. However, these implantations actually are done over the entire area of the layer 126 as has been pointed out above. These ion implantations are conducted at different energy levels, as is indicated by the differing lengths of the respectively referenced arrows 128 and 130. By using different energy levels for the ion implantations, the ions of the implanted material are driven to different depths into the polysilicon material of the layer 126. However, the implanted ions of a particular implantation are driven to substantially similar depths in the polysilicon material of layer 126. Consequently, distinct sub-layers of doped and undoped (or relatively more heavily and more lightly doped) polysilicon are created in the layer 126. These sub-layers are referenced on FIG. 15 with the numerals 126a–126e. The sub-layers 126b and 126d are the more highly doped sub-layers.

Figure 16:
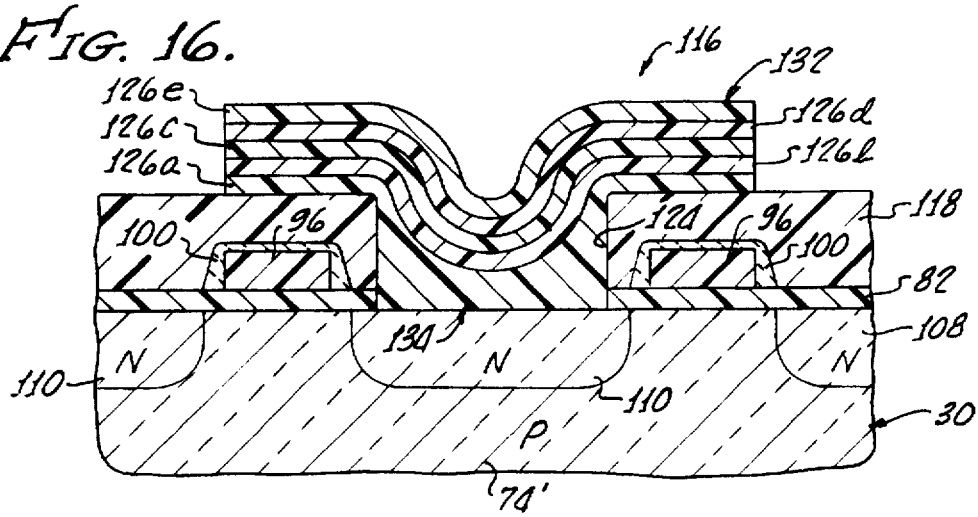

Referring to FIG. 16, a photoresist layer (not shown) is applied, patterned, and partially removed to leave a generally circular area of photoresist centered around the hole 124. Subsequently, the portion of polysilicon layer 126 which is not covered by the circular area of photoresist is anisotropically etched away, leaving the structure seen in FIG. 16. For example, the anisotropic etching operation may be conducted using reactive ion etching (RIE), to create substantially vertical side walls on the structure seen in FIG. 16. In plan view this structure above the layer 118 of oxide is preferably generally circular, but may have other alternative plan-view shapes such as elliptical or triangular, for example, recalling FIG. 4.

Figure 17:
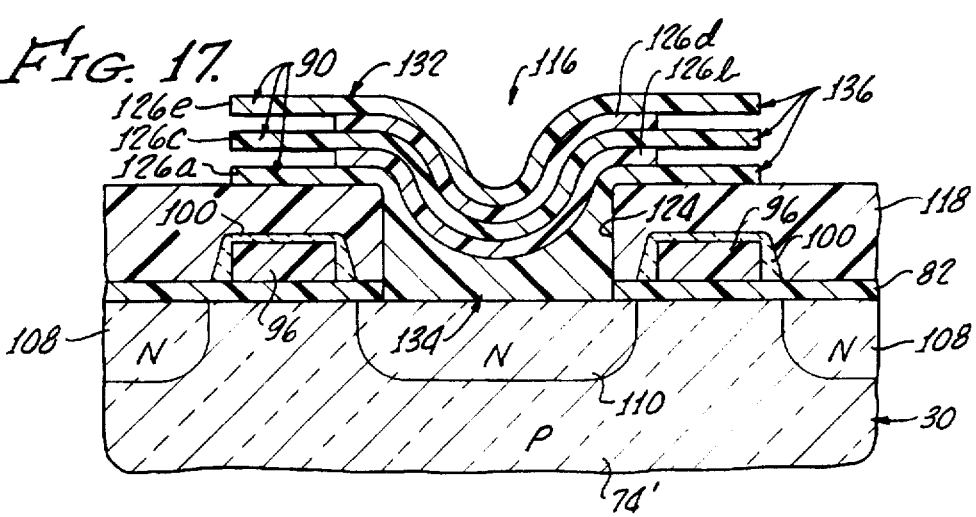

FIG. 17 shows that a subsequent isotropic etching operation preferentially and partially removes the doped sub-layers 126b and 126d. Consequently, as FIG. 17 illustrates, a generally circular, somewhat annular capacitor "plate" structure 132 formed of alternating sub-layers of doped and undoped (or more heavily and more lightly doped) polysilicon is left on the oxide layer 118. This one capacitor plate structure 132 includes a stem portion 134 extending through the hole 124 in the layers 82 and 118 of oxide to make electrical contact with the N-type implantation 108 or 110 (or with a P-type implantation 112 or 114 as pointed out above), and was generally referred to with the numeral 52 in FIG. 2. The capacitor plate structure 132 also includes plural annular and radially outwardly extending individual fins 136, which were generally referred to with the numeral 56 in FIG. 2.

Figure 18:
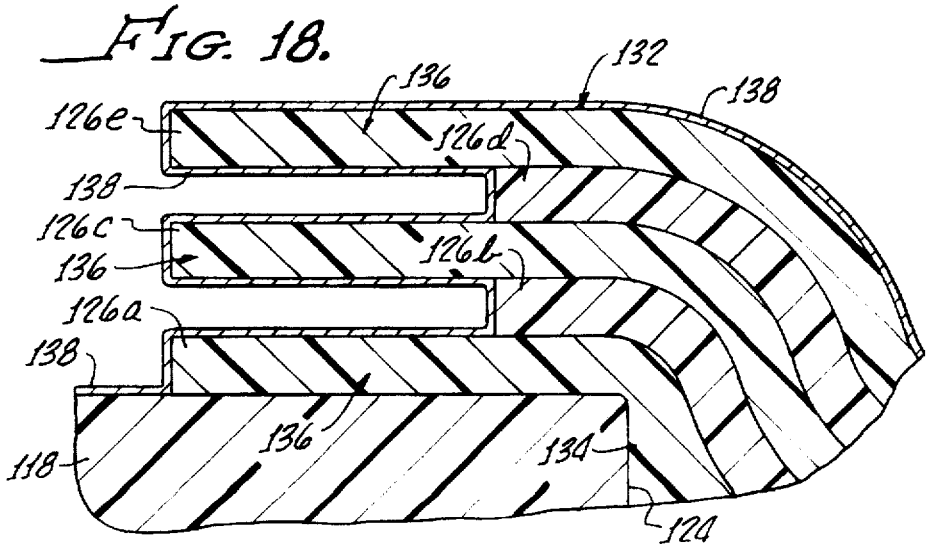

FIG. 18 illustrates that a thin covering insulating layer 138 of dielectric material is deposited over the capacitor plate structure 132 and between the fins 136. The dielectric material of the layer 138 conformably coats all exposed conductive surfaces of the capacitor plate structure 132. This dielectric material may be formed by thermal oxidation, CVD, or MBE processes, for example. Further, a material such as tantalum pentoxide may be used as the capacitor dielectric material of layer 138.

Figure 19:
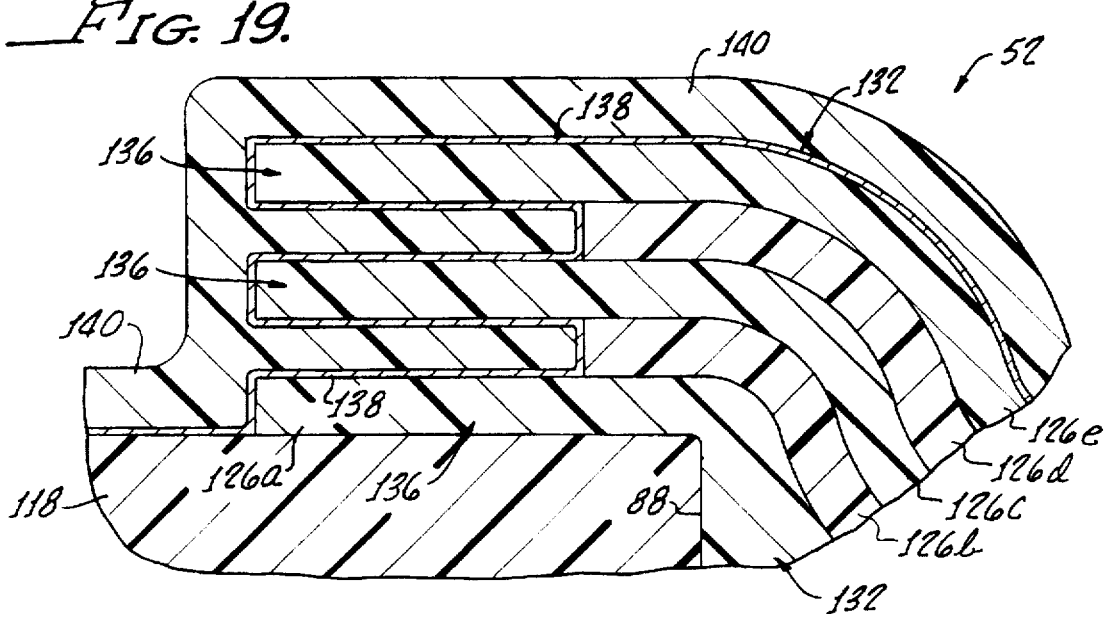

FIG. 19 shows that after the layer 138 of capacitor dielectric material is applied conformably over the capacitor one plate structure 132, another polysilicon layer 140 is conformably applied over the structure 132, and between the fins 136. This polysilicon layer 140 conductive polysilicon forms the other plate structure of the schematic capacitor 24 seen in FIG. 1, and is common to all of the multitude of capacitors of the DRAM cell 28. In FIG. 2, this common capacitor plate layer 140 can be seen as the outermost layer of the capacitor structures 52, which was generally indicated with the reference numeral 60.

Figure 20:
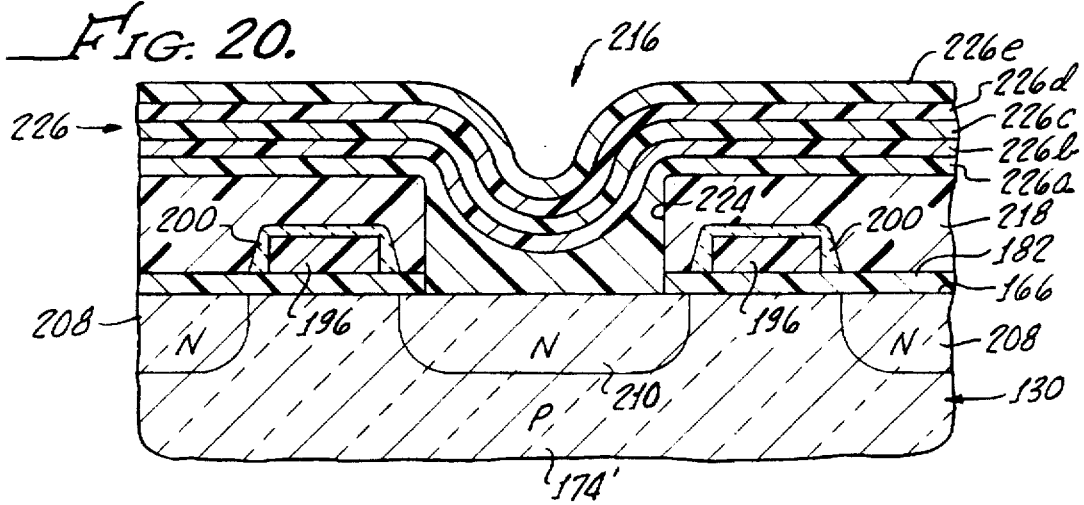
FIG. 20 provides a diagrammatic cross sectional view similar to FIG. 15, of a work piece for a DRAM memory integrated circuit according to the present invention, and illustrates steps in the method of manufacture of several alternative embodiments of the DRAM.
Figure 21:
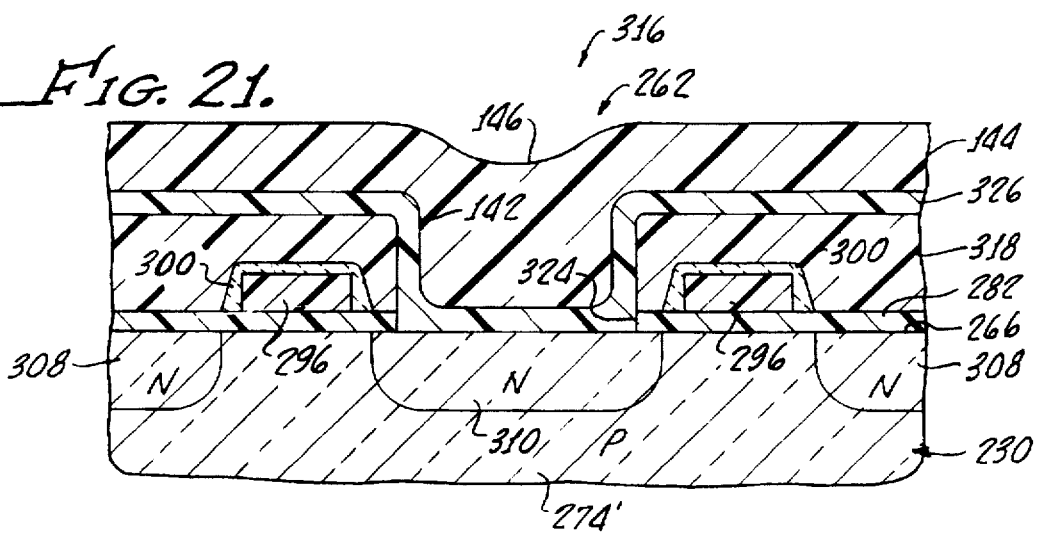

FIG. 20 illustrates a work piece according to an alternative embodiment of the present invention at an intermediate stage of manufacture. FIG. 20 depicts a structure which is similar to that seen in FIG. 15. However, the alternating doped layers 226a–226e of the embodiment seen in FIG. 20 are not achieved by use of ion implantation. Instead, the layer 226 is deposited in plural steps as a series of alternating layers one on the other. Alternate layers 226a–226e are formed of alternate ones of selected pairs of materials. These material pairs are selected for their different etching rates during isotropic etching. More particularly, alternate ones (i.e., layers 226b and 226d) of the layers in layer 226 are formed of doped (or are more highly doped) material. The other layers 226a–226e of layer 226 are either not doped (or are more lightly doped), respectively. Alternatively, the alternate layers 226a–226e of the layer 226 are formed of other material pairs which isotropically etch at differing rates. After the structure seen in FIG. 20 is formed in this way, the remainder of the manufacturing process is conducted as explained with reference to FIGS. 13–19.

FIG. 20 also illustrates additional alternative embodiments of the present invention at the same intermediate stage of manufacture. In order to obtain reference numerals for use in describing this alternative method of making the capacitors 24 of the DRAM cell 28, features which are the same or analogous in structure or function to features described above are referenced with the same numeral used above and increased by 100. One alternative embodiment of the present invention involves depositing the layer 226 as alternating layers of amorphous and poly-crystalline silicon. That is, the layers 226b and 226d are formed of poly-crystalline silicon, while layers 226a, 226c, and 226e are formed of amorphous silicon. With this structure, the subsequent isotropic etching operation is performed selectively to the poly-crystalline silicon of layers 226b and 226d, to leave essentially the structure seen in FIG. 16, but having fin portions of amorphous silicon.

Still alternatively, the alternating layers 226a–226e of layer 226 may be formed of alternating layers of silicon and silicon/germanium. With this structure, the isotropic etching operation is performed selectively to the composition of one of the alternating different layers of layer 226. If desired, the structure may be partially oxidized, and an etchant which is selective to the oxide composition may be used to carry out the isotropic etching operation. That is, the capacitor plate structure 132 alternatively may be formed of alternate layers of amorphous silicon and silicon oxide (i.e., partially oxidized silicon); or of alternating layers of amorphous silicon and polysilicon, either one of which may be partially oxidized. The essential nature of the alternate layers of material of the capacitor plate structure 132 is that they isotropically etch at differing rates.

FIGS. 21–24 illustrate steps in another alternative method of making a DRAM in accord with the present invention. In order to obtain reference numerals for use in describing this alternative method of making the capacitors 24 of the DRAM cell 28, features which are the same or analogous in structure or function to features described above are referenced with the same numeral used above and increased by 200. In this embodiment, the polysilicon layer 326 is comparatively thinner, and is conformal to the surface of the oxide layer 318, including the hole 324. Consequently, the polysilicon layer 326 also defines a recess 142 aligned with the hole 324. Over the layer 326 of polysilicon is formed a thick layer 144 of oxide. The thick oxide layer 144 still has a recess 146 aligned with the hole 324, although this recess in not as pronounced as the recess 142 because of the thickness of this oxide layer.

FIG. 22 shows that oxide layer 144 is then planarized to provide a smooth surface 148. This planarizing may be conducted using any of several available technologies. For example, the planarizing of layer 144 may be conducted by etching or by mechanical operations such as lapping or grinding, for example. A polysilicon layer 150 and a subsequent layer 152 of oxide are formed on the planarized layer 144 of oxide. A photoresist layer (not shown) is than applied, patterned, and partially removed to provide a hole in the photoresist layer aligned with the hole 324.

FIG. 23 illustrates that a subsequent anisotropic etching operation provides a hole 154 through the layers 144, 150, and 152, down to the polysilicon layer 326. FIG. 24 shows that subsequently a conformal polysilicon layer 156 is formed over the layer 152, and into the hole 154 to contact the polysilicon layer 326. This conformal polysilicon layer 156 defines a recess 158, which recess will be central of the resulting capacitor structure. FIG. 24 illustrates a precursor structure similar to that shown in FIG. 13. Accordingly, subsequent manufacturing steps as illustrated and discussed in connection with FIGS. 14–17 are employed to complete formation of the capacitor 18 of a DRAM cell 28.

FIGS. 25–27 illustrate steps of another alternative method in accordance with the present invention for making a DRAM. In order to obtain reference numerals for use in describing this alternative method of making the capacitors 18 of the DRAM cell 28, features which are the same or analogous in structure or function to features described above are referenced with the same numeral used above and increased by 300. Viewing FIG. 25, it is seen that upon the oxide layer 418, alternating layers 160, 162, 164, and 166 are formed. Layers 160 and 164 are preferably formed of poly-crystalline silicon, while layers 162 and 166 are formed of silicon oxide. Other alternating layers of the alternate materials set forth above may be used as alternatives to oxide and polysilicon. A layer 168 of photoresist is formed over the layer 166 of oxide, and is patterned and partially removed to define a hole 170, as is seen in FIG. 26. FIG. 26 also shows that an anisotropic etching operation is performed through the hole 170 of photoresist layer 168, through the oxide and polysilicon layers 160–166, through the oxide layers 382, 418, and to the surface 366 of substrate 330, forming a hole 172.

FIG. 27 illustrates that the photoresist layer 168 is subsequently removed, and that a conformal layer 174 of polysilicon is formed over the oxide layer 166 and into the hole 172, contacting the N-type implantation 410 in substrate 330 at surface 366. The layer 174 of polysilicon electrically connects the layers 160, and 164 together so that the capacitor plate structure so formed includes plural annular plates which are connected electrically to one another similarly to the structures described above. The resulting structure is similar to that depicted in FIG. 13, and subsequent processing steps as depicted in FIGS. 14–17 are utilized to complete the structure of capacitor 24 for DRAM cell 28.

FIGS. 28–30 illustrate steps in yet another alternative method of making a DRAM in accord with the present invention. The embodiment of FIGS. 28–30 and the methodology of making this depicted structure is similar to the methodology of making a DRAM according to the method of FIGS. 25–27. In order to obtain reference numerals for use in describing this alternative method of making the capacitors 18 of the DRAM cell 28, features which are the same or analogous in structure or function to features described above are referenced with the same numeral used above and increased by 400. FIG. 28 shows substrate 430 with P-well, and N-type implantations, oxide layer 482, gates 496, and covers 500, and oxide layer 518. On the oxide layer 518 is formed alternating layers of poly-crystalline silicon (560, 564), and silicon oxide (562, 566), with each being separated from the next by a thin layer (176) of dielectric material. The dielectric material may be tantalum pentoxide, or other suitable electrically insulating material. Also, the alternating materials of the alternate layers 560–566 may be selected from the alternative material pairs set out above. A similar layer 178 of dielectric material is also formed on the layer 566 of oxide.

A layer 180 of photoresist is applied over the upper most layer 178 of dielectric material, is patterned, and is partially removed to leave a hole 182 aligned with the N-implantation 510. FIG. 29 shows that an anisotropic etching operation is then performed to create a hole 184 extending to the surface 466 of substrate 430. FIG. 30 shows that a layer 574 of polysilicon is then applied conformably over the uppermost dielectric layer 176, and into hole 184 forming a recess 186. This layer 574 of polysilicon material electrically connecting with the polysilicon layers 560 and 564. An additional layer 578 of dielectric material is conformably applied over the polysilicon layer 574.

FIG. 29 also shows that an insulating oxide portion 188 is formed at the radially outer extent of the fins 536. This insulating oxide portion 188 is effective to prevent electrical contact between the conductive polysilicon layers 560, 564, 574, and an outer conductive layer like the outer polysilicon layer 140 described earlier (recalling polysilicon layer 140 of FIG. 19). When the alternating materials of layers 560–566 and 574 are polysilicon and oxide, then oxide portions 188 will not be needed and will not form at the radially outer extent of the layers 562 and 566 because these layers are already formed of oxide. The same is true when the alternating layers are amorphous silicon and silicon oxide. However, when the alternating layers 560–566 and 574 are formed of material pairs such as more heavily doped and more lightly doped amorphous or polysilicon, polysilicon and amorphous silicon, or silicon and silicon germanium, then oxide portions 188 will form on the layers 562 and 566 as well. These oxide portions are depicted in FIG. 30 on the layers 562 and 566 in order to completely illustrate the invention. The dielectric layers 176, and 178 are effective along with the oxide portions 188 to electrically insulate the capacitor plate structure 532 from the outer capacitor plate (which is formed by a conductive layer like the polysilicon layer 140, recalling FIG. 19 and using the reference numeral for this conductive layer as seen in the earlier FIG.) when this latter plate of the capacitor structure is formed.

The resulting structure seen in FIG. 30 is similar to that of FIGS. 18 and 19. Additional steps will be employed to complete the capacitor structure 18 for a DRAM cell 28. However, the step illustrated in FIG. 19 of forming a conformal insulating dielectric layer (138) over the capacitor plate structure (132) will not be necessary with the methodology depicted and described with reference to FIGS. 28–30 because the layers 176 and 178 along with oxide portions 188 serve the function of insulating the capacitor plates from one another. Additionally, the methodology depicted and described with reference to FIGS. 28–30 has the advantage of providing extremely uniform thicknesses of dielectric (i.e., layers 176 and 178) between the plates of the capacitor 18. Consequently, the capacitance values of the multiple capacitors of the DRAM cell 28 are made more uniform, and charge storage on these capacitors is more durable because the chances are reduced of a thin area of dielectric being present where stored charge could leak away through the dielectric material.

Additional manufacturing steps will subsequently be performed to provide the other features of the DRAM cell 28 described with reference to FIGS. 2–4.

Figure 31:
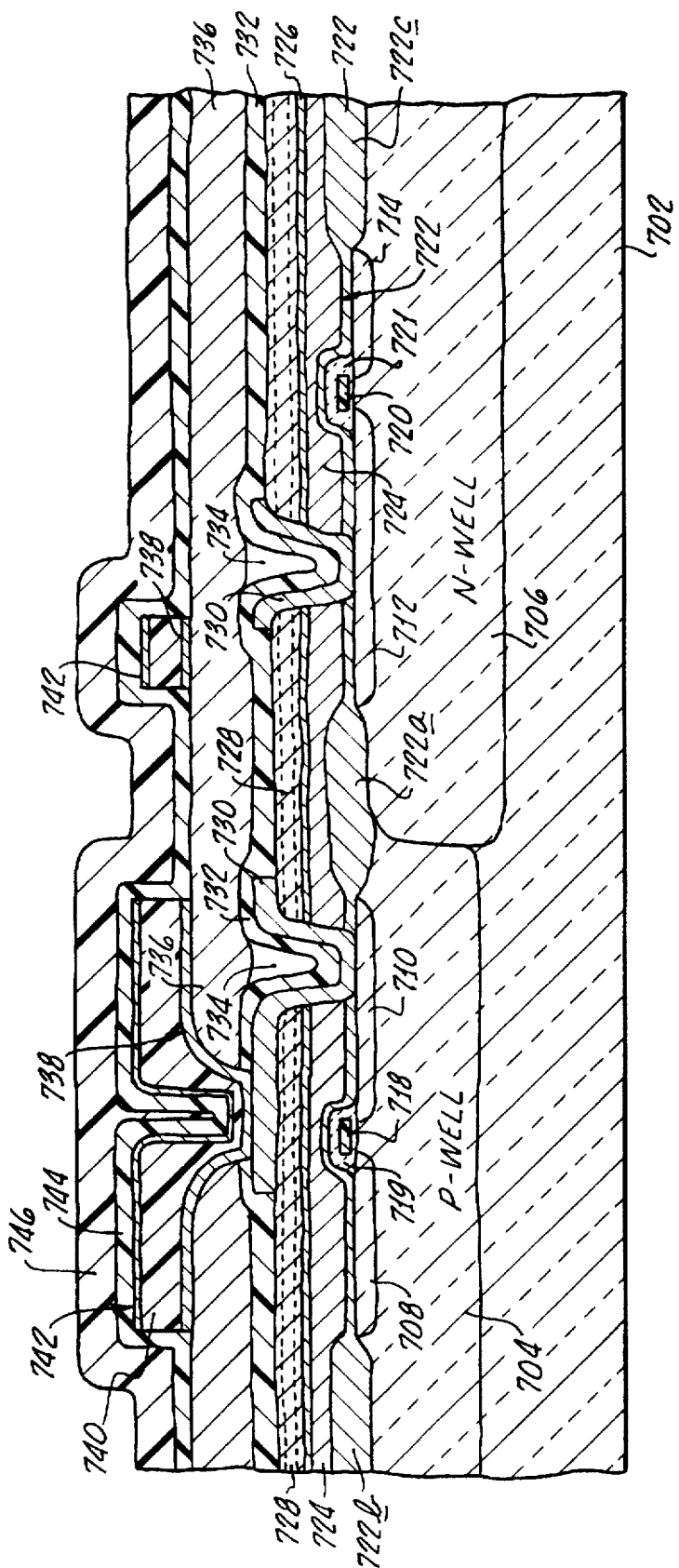
FIG. 31 is a cross sectional view of a semiconductor device that may be used to form a DRAM, formed according to the techniques of the present invention.

FIG. 31 illustrates a semiconductor device 700 having an underlying CMOS structure. In this example, a CMOS structure is used to illustrate an exemplary 'precursor' structure for the device 700. The CMOS structure is formed in a substrate 702 to include a P-well 704, an N-well 706, drain and source implants 708 and 710 in the P-well, drain and source implants 712 and 714 in the N-well, a polysilicon gate electrode 718 bridging the drain and source implants 708 and 710 in the P-well 704, and a polysilicon gate electrode 720 bridging the drain and source implants 712 and 714 in the N-well. Suitable dimensions for these elements are: 5.0–7.0 mm for the depth of the P-well; 7.0–9.0 mm for the depth of the N-well; 0.15–0.25 mm for the depth of the source/drain diffusions; and 0.10–0.16 mm for the thickness of the polysilicon gates. The gate electrodes and other polysilicon features of the device 700 are preferably defined by a good quality dry etch technique that will not result in stringers or spurs.

The P-well portion of the structure 700 forms an N-Channel transistor (NMOS) which, in conjunction with a capacitor structure, forms a dynamic random access memory (DRAM) cell. A single (as shown) or dual (not shown) sidewall spacer 719 and 721, formed of oxide, is deposited around each of the gate electrodes 718 and 720, respectively, to reduce internal capacitance and hot-carrier effects. An extremely thin layer of gate oxide (not shown) is formed on the surface of the substrate, at least under the gate electrodes 718 and 720.

An oxide layer 722 (oxide on diffusion) is formed on the surface of the substrate. The oxide layer 722 is relatively thin (e.g., 0.10±0.02 mm) over the source/drain diffusions. The oxide layer 722 exhibits substantial thickening (e.g., 0.3–0.5 mm) in a segment 722a overlying the interface of the P-well 704 and complementary N-well 706. The N-well 706 may diffuse deeper than the P-well 704 as illustrated in FIG. 31. The N-well 706 is somewhat (e.g., 0.1 mm) higher than the P-well 704, and the thick isolation oxide segment 722a exhibits a step (e.g., 0.1 mm) down into the P-well.

The thickened region, 722a, and additional thickened regions 722b and 722c preferably are LOCOS structures that may be formed by a thermal process in an oxygen furnace. The regions 722a–722c exhibit some bird's beaks that can be reduced by suitable etching.

A first intermediate oxide layer 724 (intermediate oxide 1), such as a thin layer of densified or undoped oxide is formed on the thick layer of BPSG (i.e., boron phospohorous silicon glass). The BPSG preferably contains 5.0–5.6 wt. percent phosphorous and 4.6–5.2 wt. percent boron and is formed over the CMOS structure and is on the order of 1.5 pm thick at its thickest points. This layer is quite thin, on the order of 0.25 mm thick, at its thinnest points above the gate electrodes 718 and 720 and above the thickened portions of the oxide on diffusion 722. This layer 724 is suitably applied as a blanket deposition, which will be substantially conformal to the topology of the underlying surface. In this case, the underlying surface is quite irregular. Hence, it is desirable to effect some kind of planarization of the intermediate oxide layer 724, prior to forming subsequent structures on the device.

Figure 32A:
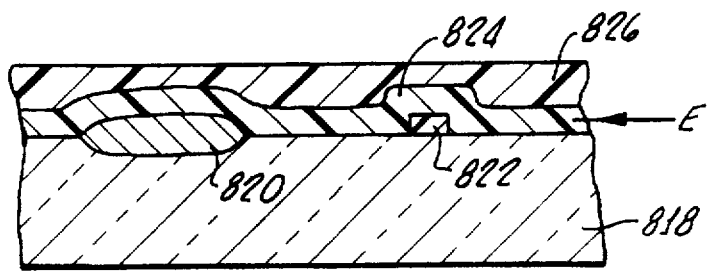
FIGS. 32A–32C illustrate planarization steps that may be used in forming the device of FIG. 31.
Figure 32B:
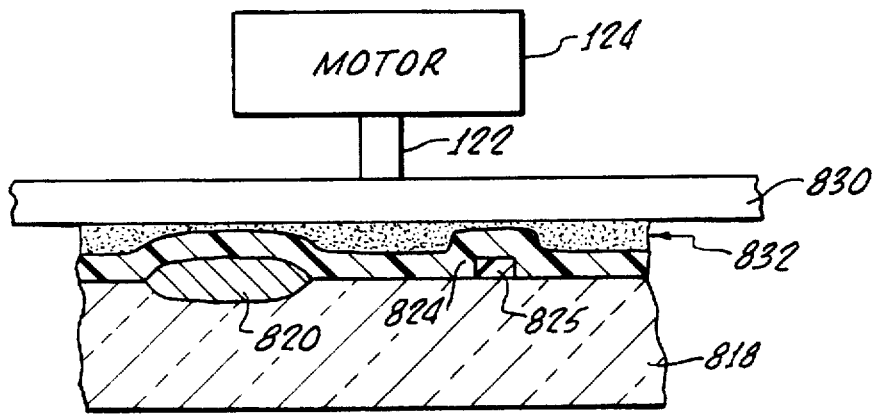
Figure 32C:
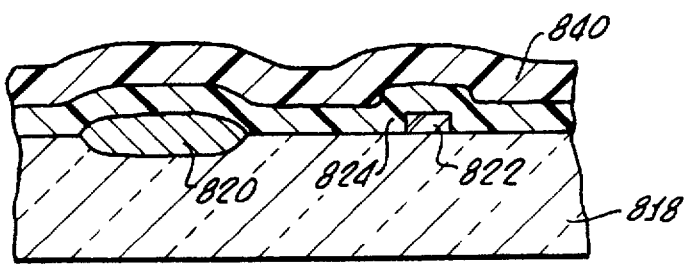

According to one embodiment of the invention, illustrated in FIG. 32A, an etching process is used to planarize the intermediate oxide layer 724. In FIGS. 32a, 32b, and 32c, layer 724 is indicated with the numeral 824 to distinguish these alternatives. A sacrificial layer of low-viscosity material 826 is applied over the irregular upper surface of the intermediate oxide layer 824 of FIG. 12. It is important that the layer 826 be formed of a material is flowable (low viscosity), so that its top surface will be substantially planar.

The material for the layer 826 is selected for its etch rate, vis-à-vis the etch rate of the underlying layer 824, so that in a given etch process the layers 826 and 824 will etch at substantially the same rate. For example, the material of the layer 826 can be photoresist or polyamide. In a subsequent etching step, the overlying layer is etched by any suitable technique such as wet, or chemical etching. This endpoint (see line E—E in FIG. 32A) of etching can be detected by the absence of the material of the overlying layer 824 from the etchant. This embodiment suffers from the need to apply, then remove, a sacrificial layer. However, the etching involved, whether chemical or plasma etching, is fairly well controlled and can be selected to proceed at a reasonably high rate.

According to an alternate embodiment of the invention, illustrated in FIG. 32B, a chemical-mechanical polishing technique is used to planarize the irregular layer 824. A rotating polishing pad 830 is urged onto the surface of an irregular layer 824 in the presence of a polishing slurry 832 (indicated by dots "·"). The polishing pad 830 is connected to a shaft 122 that is driven by a motor 124. Generally, the endpoint of chemical-mechanical polishing is somewhat more difficult to detect than in etching (see FIG. 32A), but it can be determined empirically with a high degree of reliability by polishing and examining test specimens.

Another technique for detecting the endpoint of chemical-mechanical polishing is monitoring the load on the motor driving the polishing pad 114 on the basis that the load curve will abruptly even out when the surface being polished is devoid of topological features. In FIGS. 32A and 32B, prior to planarizing, the layer 824 is evidently initially sufficiently thick to ensure that a planar top surface can be achieved without exposing the underlying features. One advantage of employing a chemical-mechanical process for planarizing a layer is that it does not require the preapplication of a sacrificial layer (compare the embodiment of FIG. 14A), and avoids heating the substrate as would be required in plasma etching.

According to yet another embodiment of the invention, illustrated in FIG. 32C, a layer 840 of flowable glass, such as spin-on glass (SOG) or heavily-doped glass, is applied over the layer 824 to planarize the top surface topology of the device 700 at this point in its fabrication. The glass 840 is deposited and densified, both of which require a thermal process. At this stage, there are two possibilities: (1) continuing the thermal processing (at an elevated temperature) to re-flow the glass 840; or (2) chemical-mechanically planarizing the glass in the manner set forth with respect to FIG. 32B, without the additional thermal re-flow step.

The first option (deposit, densify and re-flow) is well known, and places a significant strain on the thermal budget allocated for the fabrication of the device (e.g., the device 700). It is known that such thermal treatments will cause further diffusion of the implants, which necessitates accommodating such further diffusion by spacing elements farther apart. Since small device geometry is the object of prolonged endeavor, any thermal step subsequent to implanting and diffusing tends to be counter-productive. In this preferred embodiment, process steps include: (a) depositing a layer of glass over a silicon substrate containing underlying topological features, at a temperature of about 700°–800° C.; (b) densifying the glass layer at a temperature of approximately 800° C.; and (c) polishing the glass layer, preferably by chemical mechanical polishing (however, mechanical polishing is also possible); thereby forming a substantially planar glass passivation layer without reflowing the glass layer. In this preferred embodiment of the invention, the glass layer is deposited and densified with a total temperature cycle limited to temperatures required to deposit and densify the glass, and is polished by chemical-mechanical polishing.

Referring again to FIG. 31, there is shown a layer 726 of densified or undoped oxide formed over the now planarized intermediate oxide layer 724. A second intermediate layer 728 of oxide, such as BPSG, is formed over the layer 726, and is suitably in the range of from 0.1 to 2.4 mm. These two layers 728 and 726 together comprise an INTERMEDIATE OXIDE 2 layer.

Vias are formed through the layers 728, 726, 724 and 722, and are filled with metal, preferably tungsten, on the order of 0.35 0.45 mm thick, to make contact to respective source and drain implants in the N- and P-wells. Two of these plugs 730 are shown in FIG. 31, for illustrative clarity. These plugs exhibit good sidewall coverage in the vias, but only partially fill the vias, leaving voids, as shown in FIG. 31.

An interlevel layer 732 of oxide (INTERLEVEL OXIDE 1), preferably undoped silicon dioxide, is formed over the tungsten plugs 730 (i.e., over the layer 728 after the tungsten plugs 730 are formed). This layer 732 is substantially conformal to the underlying irregular topology, exhibiting thicknesses ranging from about 0.15 mm (at the thinnest points) to about 0.45 mm (at the thickest points), and exhibits depressions (or troughs) similar to (i.e., conforming substantially to) the voids exhibited by the tungsten plugs 730. Hence, a sufficient amount of filler glass 734 is applied, such as by spin-on techniques, to fill the depressions in the layer 732 so that the resulting top surface is substantially smooth, albeit not extremely planar. As illustrated, the filler glass 734 will also smooth other irregularities (e.g., corners, steps) in the underlying layer 732. Preferably, the tungsten plugs are deposited using a CVD process, and are defined using a dry etch process.

Preferably, the INTERLEVEL OXIDE 1, which is indicated by the reference numeral 732 in FIG. 31, is partially planarized prior to deposition of the filler glass 734. This partial planarization may be performed using the techniques described with respect to FIGS. 32A–32C.

An interlevel layer 736 of oxide (INTERLEVEL OXIDE 2), preferably undoped silicon dioxide, is applied over the INTERLEVEL OXIDE 1 layer 732 (and over filler glass 734), to a thickness of 0.30–0.40 mm, and vias (one shown) are formed through this layer, and also through the layer 732 and also through any incidental portions of the layer 734 that are aligned with the vias.

A barrier metal layer 738 is applied to a thickness of about 0.20–0.30 mm, over the layer 736. The barrier metal layer 738 preferably is formed of an alloy containing titanium and/or tungsten. The barrier metal layer 738 makes contact through the aforementioned vias in the INTERLEVEL OXIDE 2 layer 736 with the underlying tungsten plugs 730 (one such contact shown, for illustrative clarity). A metal filler 740 is applied over the barrier metal layer 738. The metal filler 740 preferably is formed of aluminum containing 0.70–0.80 wt. percent silicon and 0.30–0.40 wt. percent copper. The metal filler 740 preferably has a thickness of about 0.6–0.8 mm. A metal (such as titanium-tungsten) cap layer 742 is applied over the metal filler 740, as shown, to a thickness of about 0.04–0.06 mm. A dry etch process is preferred for patterning these metal layers 738, 740 and 742.

A first passivation layer 744 is applied to a thickness of about 0.2–0.4 mm over the metal cap layer 742. The first passivation layer 744 may be formed of a material such as undoped silicon dioxide. A second passivation layer 746, preferably formed of silicon nitride, is applied to a thickness of about 1.0–1.4 mm over the first passivation layer 744.

A die coat (not shown), of polyimide, is suitably applied over the device 700, to a thickness of about 8.0–12.0 mm, to protect against alpha particle-induced leakage.

The device 700 can suitably be employed as a unit memory element (memory cell), by connecting the two CMOS structures in series with one another (the source of one of the MOS transistors being connected to the drain of the other MOS transistor). As mentioned hereinbefore, a 'stacked' storage capacitor can be formed over the N-Channel (P-well) portion of this device 700 to form a DRAM cell.

The structure 700 can be replicated numerous times over a semiconductor die to form various DRAM chips of various capacity, such as 16, 64, 256, 1024 megabytes. The ultimate memory capacity of the completed DRAM device depends on the die size and on the particular sub-micron technology used to fabricate the device. For large capacity DRAM devices, metal lines (geometries) of 0.6 mm or less (including less than "n" microns, where "n" is 0.5, 0.4, 0.3 or 0.2), and polysilicon geometries of half the metal dimensions would be preferred, to minimize line delays and to increase device density.

While the present invention has been depicted, described, and is defined by reference to particularly preferred embodiments of the invention, such reference does not imply a limitation on the invention, and no such limitation is to be inferred. The invention is capable of considerable modification, alteration, and equivalents in form and function, by those ordinarily skilled in the pertinent arts. For example, the manufacturing processes used to fabricate the DRAM device may be selected to eliminate use of ozone-depleting chemicals from the manufacturing process. That is, use of chemicals on the EPA's 33/50 chemical list may be reduced or eliminated. Particularly, reduced use of ethylene-glycol esters and/or CFCs may be achieved. Moreover, the best available practices may be utilized in the manufacturing of a DRAM according to the present invention. Pursuant to this objective, advanced mix-and-match fabrication applications may be utilized in an advanced high-volume manufacturing environment. This manufacturing environment may include packaging of the resulting DRAM in thin small-outline packages. Advanced mix-and-match fabrication, devices with feature sizes of 0.25 micron, for example, require considerable better stepper resolutions than the current 0.75 to 0.80 micron accuracies. Thus, 5:1 or 4:1 reductions of the stepper increments are employed in critical areas of the devices to proved best accuracies. A 1:1 stepper operation is used in the noncritical areas of the device in order to provide both high quality and fast through-put at a lower cost. In this regard, it should be recalled that the costs of lithography represent about 35% of finished wafer costs. Accordingly, the depicted and described preferred embodiment of the invention is exemplary only, and is not exhaustive of the scope of the invention. Consequently, the invention is intended to be limited only by the spirit and scope of the appended claims, giving full cognizance to equivalents in all respects.

I claim:

1. A self-aligning photolithographic method of making a CMOS-DRAM device having multiple memory cells, each said multiple memory cells including a FET and a capacitor, comprising the steps of:

providing a substrate of silicon semiconductor material;

forming a first silicon nitride layer on said substrate;

patterning said first silicon nitride layer to define an opening through said first silicon nitride layer to said substrate;

forming a first well by a method that includes the steps of:

implanting a first dopant of a first conductivity type into a first sub-surface region of said substrate through said opening, such that said sub-surface region is self aligned with a portion of said substrate that is aligned with said opening; and using said first silicon nitride layer to substantially prevent said substrate from being implanted with said first dopant except at said opening;

forming a first layer of silicon oxide in said opening;

removing said silicon nitride layer;

forming a second well adjacent said first well by a method that includes the steps of:

implanting a second dopant of a conductivity type opposite to the first conductivity type of the first dopant into a second subsurface region of said substrate that is adjacent to said first layer of silicon oxide; and using said first layer of silicon oxide to substantially prevent implantation of said second dopant into said first well;

forming in said first well region of said substrate a spaced apart pair of source and drain implants of the same conductivity type which is opposite to the conductivity type of said first well region;

forming a gate element over said substrate aligned between said pair of source and said drain implants to define said FET;

coating said gate element with a second layer of silicon oxide over said substrate;

forming a material layer over said second layer of silicon oxide;

forming a capacitor structure over said substrate in alignment with one of said source and drain implants;

including in said capacitor structure a conductive one capacitor plate structure with a portion electrically connecting through both said second layer of silicon oxide and said material layer and contacting one of said source and drain implants;

wherein forming said material layer over said second layer of silicon oxide includes the steps of:

forming a first intermediate oxide layer over said second layer of oxide, which first intermediate oxide layer has an irregular upper surface;

planarizing said upper surface of said first intermediate oxide layer; and forming a second intermediate oxide layer over said planarized upper surface of said first intermediate oxide layer.

2. The method of claim 1 further including the steps of:

forming a second silicon nitride layer on said substrate;

patterning said second silicon nitride layer to define a pair of spaced apart silicon nitride segments that align respectively with said source and drain implants;

thickening said first layer of silicon oxide by local oxidation on said substrate where said substrate is not covered by said segments of said second silicon nitride layer;

removing said segments of said second layer of silicon nitride;

forming a gate element on said substrate in alignment over portions of said substrate not covered by second layer of silicon nitride; and implanting a source and drain dopant of conductivity type opposite to said one well into said substrate to form said source and drain implants while using said thickening of said first layer of silicon oxide, and said gate element to substantially prevent said substrate from elsewhere being implanted with said source and drain dopant.

3. The method of claim 1, further including the step of using said step of forming said second layer of silicon oxide to perform a thermal diffusion into said substrate of said ions implanted into said first well to form said pair of source and drain implants of the same conductivity type to form a channel stop between wells of opposite conductivity type.

4. The method of claim 3 further including the step of implanting ions of polarity the same as that of said first well into a sub-surface channel-stop region of said first well where said first well is not covered by said segments of said second layer of silicon nitride prior to forming said second layer of silicon oxide on said substrate.

5. The method of claim 2 further including the steps of:

implanting ions of polarity the same as that of said first well into a sub-surface channel-stop region of said first well where the latter is not covered by said segments of said second layer of silicon nitride prior to forming said second layer of silicon oxide on said substrate; and using said step of thickening said first layer of silicon oxide to perform a thermal diffusion of said ions of polarity the same as that of said first well into said substrate to form said channel-stops.

6. The method of claim 1 wherein the step of forming a capacitor includes the steps of:

providing an opening through both said first layer of silicon oxide and said material layer;

forming a conductive metallic trace on said material layer over said first layer of silicon oxide; and forming a conductive plug member extending through said opening between one of said source and drain implantations and said conductive metallic trace.

7. The method of claim 6 wherein said step of forming a conductive plug member extending through said opening between said one of said source and drain implantations and said conductive metallic trace includes the step of using a material selected from the group consisting of tungsten and polysilicon to form said plug member.

8. The method of claim 1 wherein said step of forming a capacitor includes the steps of:

providing an opening through said second layer of silicon oxide;

providing a conformal coating of a material selected from the group comprising tungsten and silicon over said second layer of silicon oxide, and into said hole to contact said one source or drain implant;

patterning said conformal layer of material to define a part of said one capacitor plate structure and a forming a conductive stem extending from said one capacitor plate structure through said hole to said one source or drain implant.

9. A method of making a CMOS DRAM having a memory cell including a FET and a capacitor, comprising the sequential steps of:

providing a silicon substrate having a surface;

forming a first layer of silicon nitride on said substrate;

patterning said first layer of silicon nitride to provide an opening therethrough;

forming a first well by a method that includes the steps of:

implanting respective P-type or N-type ions into a shallow sub-surface region of said substrate though said opening in said first silicon nitride layer at the location of a first one of said wells;

using said patterned layer of silicon nitride to prevent implantation of said ions for said first well into said substrate at a selected location where a second well is to be formed; and diffusing implanted ions for said first well from said shallow subsurface region into said substrate;

forming a layer of silicon oxide over said first well;

removing said first layer of silicon nitride;

forming a second well adjacent said first well by a method that includes the steps of:

implanting into a shallow subsurface region of said substrate where the latter is not covered by said layer of silicon oxide ions for said second well of a type opposite in polarity to said first well;

using said layer of silicon oxide to prevent implantation of said ions for said second well into said substrate at the location of said first well; and diffusing implanted ions for said second well from said shallow subsurface region into said substrate;

removing said layer of silicon oxide;

after removing said layer of silicon oxide, forming a substantially uniform layer of oxide over said substrate;

forming a second layer of silicon nitride over said substrate including said first and second wells;

patterning said second layer of silicon nitride to provide segments of silicon nitride over each of said first and second wells at sites where said FET is to be formed;

implanting ions of polarity the same as that of said first well into a sub-surface channel-stop region of said first well where the latter is not covered by said segments of said second layer of silicon nitride;

thickening said second layer of silicon oxide over said substrate where the latter is not covered by said segments of silicon nitride;

using said step of thickening said second layer of silicon oxide to perform a thermal diffusion of said ions of polarity the same as that of said first well into said substrate to form channel-stops;

removing said segments of silicon nitride to leave plateaus of said substrate covered with a substantially uniform portion of said second layer of silicon oxide;

forming a localized deposition of conductive material within each plateau to form a gate electrode;

implanting ions for the source and drain of said FET through said substantially uniform layer of silicon oxide into said substrate to form the source and drain implants of said transistor;

utilizing said second layer of silicon oxide and said localized layer of conductive material of said gate electrode to prevent implantation of ions for said source and drain into said substrate where the substrate is covered by said second layer of silicon oxide and by said conductive material; and forming said capacitor above said substrate in a layer of insulating oxide with a first plate structure of said capacitor connecting with one of said source and drain for said FET; and wherein said step of forming said capacitor in a layer of insulating oxide includes steps of:
  forming a layer of silicon oxide having an irregular upper surface over said gate electrode;
  planarizing said upper surface of said layer of silicon oxide;
  applying an additional layer of silicon oxide over said planarized upper surface of said layer of silicon oxide; and
  forming yet another layer of silicon oxide over said additional layer of silicon oxide to complete said layer of insulating oxide.

10. The method of claim 9 further including the step of forming a thin oxide layer over said surface of said substrate prior to first forming said layer of silicon nitride over said substrate.

11. The method of claim 9 wherein said step of patterning said first silicon nitride layer includes steps of:
  applying a layer of photoresist over said silicon nitride layer;
  exposing and partially removing said layer of photoresist to partially expose said layer of silicon nitride; and
  etching away said exposed part of said layer of silicon nitride to provide said opening.

12. The method of claim 9 wherein said step of thickening said second layer of silicon oxide over said first well includes the step of using thermal oxide growth to provide said layer of silicon oxide.

13. The method of claim 12 wherein said step of diffusing said implanted ions for said first well from said shallow sub-surface region into said substrate to form said first well includes the step of using an elevated temperature effected during said thermal oxide growth to effect said diffusion of said implanted ions.

14. The method of claim 9 further including the step of forming said substantially uniform portion of said second layer of silicon oxide over said substrate substantially simultaneously with said diffusing of said ions for said second well from said shallow subsurface region into said substrate to form said second well.

15. The method of claim 9 further including the step of forming a cover of silicon oxide over said deposition of conductive material forming said gate prior to implanting said ions for said source and drain implants.

16. The method of claim 9 further including the step of utilizing silicon as said deposition of conductive material forming said gate.

17. The method of claim 9 wherein the step of forming of said capacitor includes the steps of:

providing an opening through said second layer of silicon oxide;

providing a conformal silicon layer over said second layer of silicon oxide, and into said hole to contact one of said source or drain implant; and patterning said conformal silicon layer to define a part of said first capacitor plate structure and a stem extending from said first capacitor plate structure through said hole to said one source or drain implant.

18. The method of claim 17 wherein the step of forming of said capacitor includes the further steps of:

providing an insulating material outwardly disposed around said conformal silicon layer to form said first capacitor plate structure; and applying a conformal silicon layer forming a second plate structure for said capacitor surrounding said first capacitor plate structure.

19. A self-aligning photolithographic method of making a CMOS DRAM having multiple memory cells, each of said multiple memory cells including a FET and a capacitor, comprising steps of:

providing a substrate of silicon semiconductor material;

forming a P-well region in said substrate;

forming an N-well region in said substrate spaced apart from said P-well region;

forming in one of said P-well and N-well regions a spaced apart pair of source and drain implants of the same polarity which is opposite to said first well region;

forming a gate element on said substrate aligned between said pair of source and said drain implants to define said FET;

forming a layer of insulating material on said substrate and on said gate element;

forming a capacitor structure on said substrate and embedded in said layer of insulating material in alignment with one of said source and drain implants;

including in said capacitor structure a first capacitor plate structure;

providing said capacitor structure with a second capacitor plate structure;

providing a dielectric material for insulating said first capacitor plate structure from said another capacitor plate structure; and providing said first capacitor plate structure with a portion extending through layer of insulating material and contacting one of said source and drain implants; and wherein said step of forming said layer of insulating material on said substrate includes steps of:
  forming a layer of silicon oxide having an irregular upper surface over said gate element;
  planarizing said upper surface of said layer of silicon oxide;
  applying an additional layer of silicon oxide over said planarized upper surface of said layer of silicon oxide; and
  forming yet another layer of silicon oxide over said additional layer of silicon oxide to complete said layer of insulating material.

* * * * *